US012672472B2

(12) United States Patent
Kim et al.

(10) Patent No.: US 12,672,472 B2
(45) Date of Patent: Jun. 30, 2026

(54) DISPLAY DEVICE AND HEAD-MOUNTED DISPLAY DEVICE

(71) Applicant: Samsung Display Co., LTD., Yongin-si (KR)

(72) Inventors: Woo Young Kim, Yongin-si (KR); Su Jeong Kim, Yongin-si (KR); Jae Heung Ha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 397 days.

(21) Appl. No.: 18/365,363

(22) Filed: Aug. 4, 2023

(65) Prior Publication Data

US 2024/0188398 A1    Jun. 6, 2024

(30) Foreign Application Priority Data

Dec. 6, 2022    (KR) ........................ 10-2022-0168510

(51) Int. Cl.
*H10K 59/80* (2023.01)
*G02B 27/01* (2006.01)
*H10K 59/38* (2023.01)

(52) U.S. Cl.
CPC ....... *H10K 59/879* (2023.02); *G02B 27/0172* (2013.01); *H10K 59/38* (2023.02); *H10K 59/8731* (2023.02); *G02B 2027/0112* (2013.01); *G02B 2027/0178* (2013.01)

(58) Field of Classification Search
CPC .. H10K 59/879; H10K 59/38; H10K 59/8731; G02B 27/0172; G02B 2027/0112; G02B 2027/0178
See application file for complete search history.

(56) References Cited

U.S. PATENT DOCUMENTS

| | | |
|---|---|---|
| 2014/0027725 A1 | 1/2014 | Lim et al. |
| 2019/0379006 A1 | 12/2019 | Lim et al. |
| 2020/0161579 A1* | 5/2020 | Kim ..................... H10K 59/126 |

(Continued)

FOREIGN PATENT DOCUMENTS

| | | |
|---|---|---|
| JP | 2019-215541 | 12/2019 |
| KR | 10-2020-0012604 | 2/2020 |

(Continued)

OTHER PUBLICATIONS

Kang et al., "High Aspect Ratio Microdisplay and Thin Optical Component for Glass-Like AR Devices".

(Continued)

*Primary Examiner* — Mary Ellen Bowman
(74) *Attorney, Agent, or Firm* — F. CHAU & ASSOCIATES, LLC

(57) ABSTRACT

A display device comprises a substrate, an organic light emitting element layer comprising a first electrode, a second electrode, and an organic light emitting layer disposed between the first and second electrodes and emitting light in a light emitting area, an encapsulation layer covering the organic light emitting element layer, a color filter layer disposed in the light emitting area and including a plurality of color filters having different colors and a light control pattern layer disposed between the encapsulation layer and the color filter layer and including a light control pattern disposed on a light path of the organic light emitting layer.

21 Claims, 20 Drawing Sheets

(56) References Cited

U.S. PATENT DOCUMENTS

| | | | |
|---|---|---|---|
| 2022/0140008 A1* | 5/2022 | Fukagawa ............ | H10K 59/122 |
| | | | 257/98 |
| 2022/0140289 A1* | 5/2022 | Tak ...................... | H10K 59/122 |
| | | | 257/40 |
| 2022/0328794 A1* | 10/2022 | Huang ................... | H10K 59/38 |
| 2023/0071107 A1* | 3/2023 | Lee ........................ | H10K 59/38 |

FOREIGN PATENT DOCUMENTS

| | | |
|---|---|---|
| KR | 10-2020-0028257 | 3/2020 |
| KR | 10-2020-0050517 | 5/2020 |
| KR | 10-2021-0098446 | 8/2021 |
| WO | 2021/119992 | 6/2021 |

OTHER PUBLICATIONS

Adhikary et al., "Performance Evaluation of Micro Lens Arrays; Improvement of Light Intensity and Efficiency of White Organic Light Emitting Diodes".
Extended European Search Report for European Application No. 23212047.7, dated May 24, 2024.

* cited by examiner

FIG. 19

DISPLAY DEVICE AND HEAD-MOUNTED DISPLAY DEVICE

CROSS-REFERENCE TO RELATED APPLICATION

This application claims priority to and benefits of Korean Patent Application No. 10-2022-0168510 under 35 U.S.C. § 119 filed on Dec. 6, 2022 in the Korean Intellectual Property Office (KIPO), the contents of which in its entirety are herein incorporated by reference.

BACKGROUND

1. Technical Field

The disclosure relates to a display device and a head-mounted display device.

2. Description of the Related Art

The importance of display devices has steadily increased with the development of multimedia technology. In response thereto, various types of display devices such as a liquid crystal display (LCD) an organic light emitting display (OLED) and the like have been used.

Among display devices, an organic light emitting display device displays an image using an organic light emitting element that generates light by recombination of electrons and holes. The display device has advantages of having a fast response speed, a large luminance and a viewing angle, and being driven with low power consumption.

A head-mounted display device may be mounted on a user's head and may have the form of a pair of glasses or a helmet. Such a head-mounted display device displays an image in front of the user's eyes so that the user can recognize the image.

SUMMARY

Aspects of the disclosure provide a display device and a head-mounted display device.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment, a display device comprises a substrate, an organic light emitting element layer comprising a first electrode, a second electrode, and an organic light emitting layer disposed between the first electrode and second electrode and emitting light in a light emitting area, an encapsulation layer covering the organic light emitting element layer, a color filter layer disposed in the light emitting area and including a plurality of color filters having different colors and a light control pattern layer disposed between the encapsulation layer and the color filter layer and including a light control pattern disposed on a light path of the organic light emitting layer.

The light emitting area may include a first light emitting area, a second light emitting area, and a third light emitting area, and the plurality of color filters may include a color filter of a first color in the first light emitting area, a color filter of a second color in the second light emitting area, and a color filter of a third color in the third light emitting area.

The encapsulation layer may include an organic encapsulation layer and at least one inorganic encapsulation layer disposed on the organic light emitting element layer.

The light control pattern layer may further comprise a low refractive index planarization layer flattening steps formed by the light control patterns.

The refractive index of the encapsulation layer may be in a range of about 1.6 to about 1.75, the refractive index of the low refractive index planarization layer may be in a range of about 1.6 to about 1.75, the refractive index of the light control pattern layer may be in a range of about 1.7 to about 2.5, and the refractive index of the light control pattern layer may be higher than the refractive index of the encapsulation layer and the refractive index of the low refractive pattern layer.

The width of the light control pattern may become narrower toward the color filter layer.

The light control pattern may be a convex lens shape.

The light control pattern may have a frustrum shape.

One surface of the light control pattern may contact the encapsulation layer, and another surface of the light control pattern may contact the color filter layer.

A widest width of the light control pattern may be narrower than a width of the light emitting area and wider than a width of the color filter.

The ratio of a width of the light emitting area, a width of the light control pattern, and a width of the color filter may be about 1:1 to 1.5:1.2 to 1.6.

The ratio of a height of the light control pattern and the light control pattern may be about 1:0.5 to 2.

The ratio of a height of the encapsulation layer, a width of a pixel defining layer, and a width of the color filter may be about 1:0.5 to 2:2 to 5.

The color filter layer may further comprise a light blocking pattern disposed in the boundaries of each of the plurality of color filters.

The substrate may be a semiconductor circuit substrate.

According to an embodiment, a display device comprises a sub-pixel disposed on a substrate and including a first electrode, an organic light emitting layer and a second electrode, a pixel defining layer defining the sub-pixels, an encapsulation layer disposed on the pixel defining layer and the sub-pixels, and a light control pattern layer overlapping the sub-pixels, disposed on the encapsulation layer, and comprising a light control pattern disposed on a light path of the organic light emitting layer, wherein the light control pattern layer has a shape in which the width becomes greater toward the encapsulation layer, and the light control pattern layer has a refractive index higher than a refractive index of the encapsulation layer.

The encapsulation layer further includes a first inorganic encapsulation layer disposed on the organic light emitting element layer, an organic encapsulation layer disposed on the first inorganic encapsulation layer and a second inorganic encapsulation layer disposed on the organic encapsulation layer.

The refractive index of the second inorganic encapsulation layer may be about 1.6 to 1.75, the refractive index of the light control pattern layer may be about 1.7 to 2.5, and the refractive index of the light control pattern layer may be higher than the refractive index of the second inorganic encapsulation layer.

The ratio of the height of the light control pattern and the width of the light control pattern may be about 1:0.5 to 2.

The light control pattern may have a convex lens shape or a frustrum shape.

According to an embodiment, a head mounted display device comprises a display device and a connector that electrically connects the display device and a frame, wherein the display device comprises an organic light emitting element layer comprising a first electrode, a second electrode, and an organic light emitting layer disposed between the first electrode and the second electrode and emitting light in a light emitting area, an encapsulation layer covering the organic light emitting element layer, a color filter layer disposed in the light emitting area and including a plurality of color filters having different colors and a light control pattern layer disposed between the encapsulation layer and the color filter layer and including a light control pattern disposed on a light path of the organic light emitting layer.

According to embodiments of the disclosure, it is possible to solve a crosstalk problem of pixels.

In addition, color distortion can be prevented by solving the color mixing problem.

Also, due to increase of luminance and luminous efficiency, a power consumption reduction effect can be achieved.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

Figure 19:
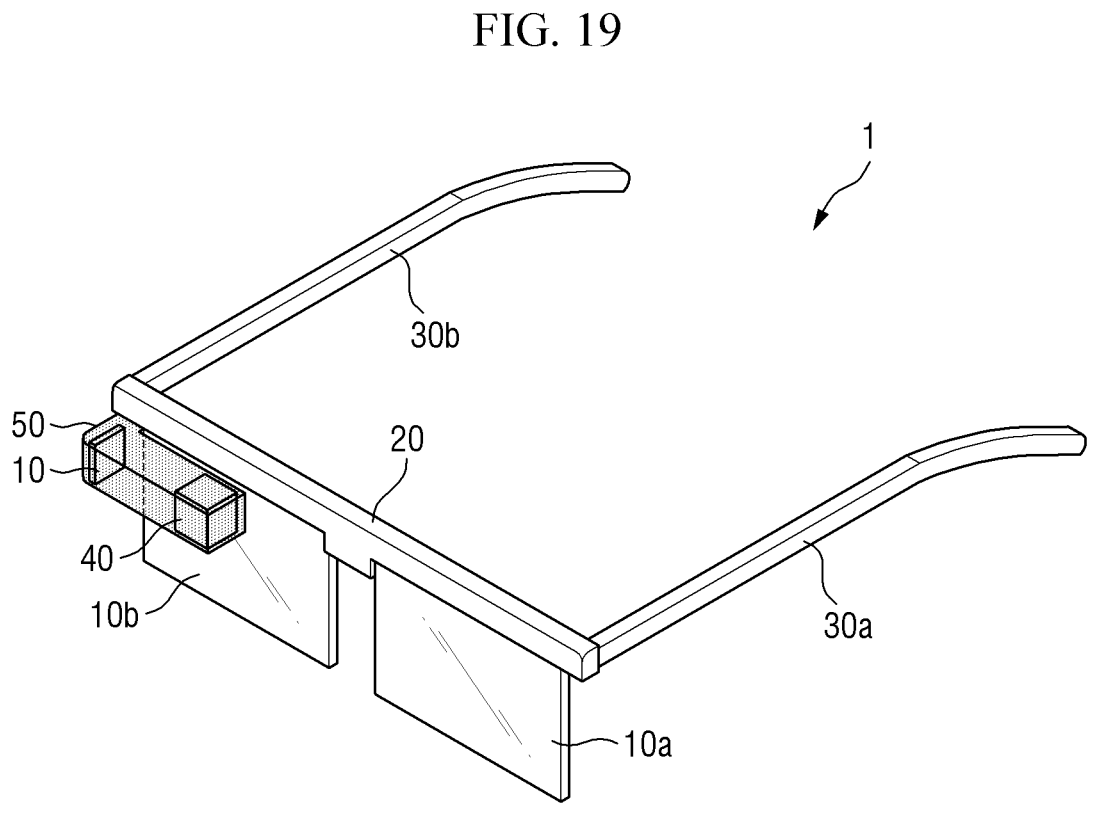

FIG. 19 is a schematic view illustrating an augmented reality device including a display device according to an embodiment.

DETAILED DESCRIPTION OF THE EMBODIMENTS

Figure 1:
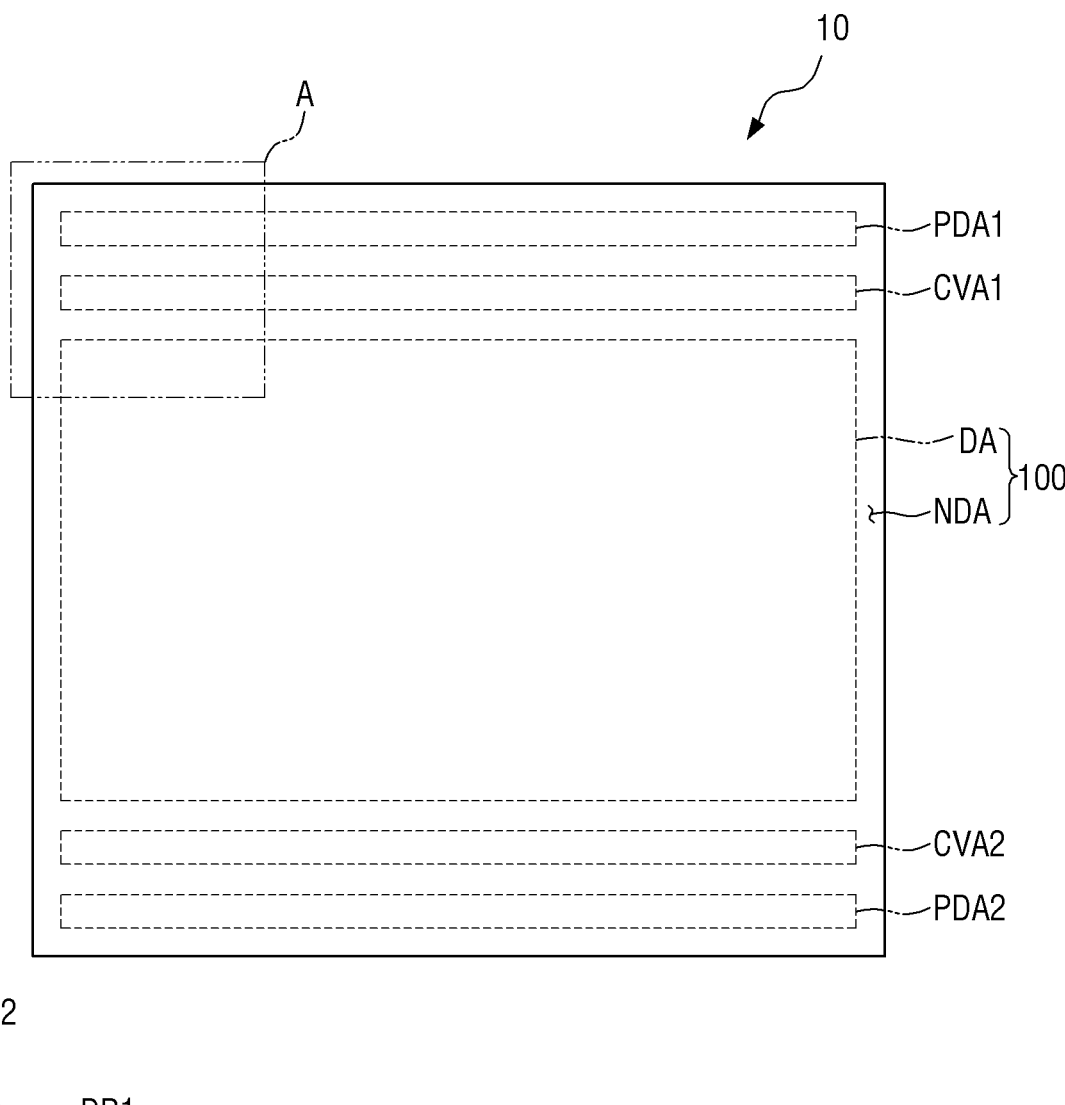
FIG. 1 is a schematic layout view illustrating a display device according to an embodiment.

The embodiments will now be described more fully hereinafter with reference to the accompanying drawings. The embodiments may, however, be provided in different forms and should not be construed as limiting. The same reference numbers and/or reference characters indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic layout view illustrating a display device according to an embodiment.

Figure 2:
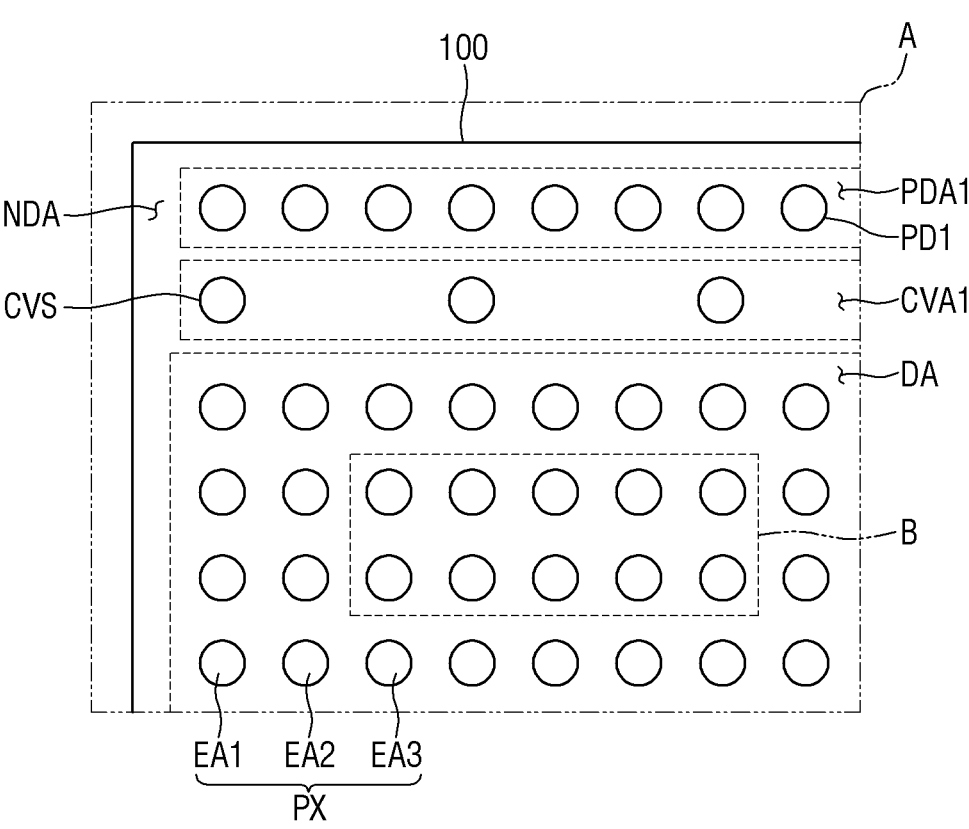
FIG. 2 is a schematic layout view illustrating area A of FIG. 1 in more detail.
Figure 2:
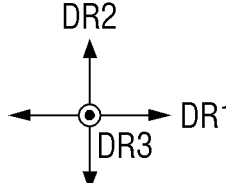

FIG. 2 is a schematic layout view illustrating area A of FIG. 1 in more detail.

In FIGS. 1 and 2, a display device 10 according to an embodiment is mainly described as being an organic light emitting diode on silicon (OLEDOS) including an organic light emitting layer on a semiconductor circuit substrate formed by a semiconductor process using a silicon wafer, but it should be noted that the embodiment of the specification is not limited thereto.

In addition, in FIGS. 1 and 2, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit substrate. In this case, "left", "right", "upper" and "lower" indicate directions when the display panel 100 is viewed from above. For example, "right side" indicates one side of the first direction DR1, "left side" indicates the other side of the first direction DR1, "upper side" indicates one side of the second direction DR2, and "lower side" indicates the other side of the second direction DR2. In addition, an "upper portion" refers to one side in the third direction DR3, and a "lower portion" refers to the other side in the third direction DR3.

Referring to FIGS. 1 and 2, the display device 10 according to an embodiment may include the display panel 100 including a display area DA and a non-display area NDA.

The display panel 100 may have a quadrilateral planar shape having long sides in the first direction DR1 and short sides in the second direction DR2. However, the planar shape of the display panel 100 is not limited thereto, and may have, e.g., a polygonal shape other than a quadrilateral shape, a circular shape, an elliptical shape, or an irregular planar shape.

The display area DA may be an area in which an image is displayed, and the non-display area NDA may be an area in which an image is not displayed. The planar shape of the display area DA may follow the planar shape of the display panel 100. FIG. 1 illustrates that the planar shape of the display area DA is a quadrilateral shape. The display area DA may be disposed in a central area of the display panel 100. The non-display area NDA may be disposed around the display area DA. The non-display area NDA may be disposed to surround the display area DA.

The display area DA of the display panel 100 may include pixels PX. The pixel PX may be defined as a minimum light emitting unit (or minimum light emitting part) capable of displaying white light.

Each of the pixels PX may include light emitting areas EA1, EA2, and EA3 emitting light. In the embodiment of the specification, it is described as an example that each of the pixels PX includes three light emitting areas EA1, EA2, and EA3, but the embodiment of the specification is not limited thereto. For example, the pixels PX may each include any number of light emitting area, e.g., four light emitting areas.

The non-display area NDA of the display panel 100 may include a first common voltage supply area CVA1, a second common voltage supply area CVA2, a first pad portion PDA1, and a second pad portion PDA2.

The first common voltage supply area CVA1 may be disposed between the first pad portion PDA1 and the display area DA. The second common voltage supply area CVA2 may be disposed between the second pad portion PDA2 and the display area DA.

The first common voltage supply area CVA1 may include multiple common voltage supply units (or common voltage supply parts) CVS. The common voltage supply units CVS may be electrically connected to any one of the first pads PD1 of the first pad portion PDA1. For example, the common voltage supply units CVS of the first common voltage supply area CVA1 may be supplied with a common voltage from any one of the first pads PD1 of the first pad portion PDA1.

The common voltage supply units CVS of the second common voltage supply area CVA2 may be electrically connected to any one of the second pads of the second pad portion PDA2. For example, the common voltage supply units CVS of the second common voltage supply area CVA2 may be supplied with a common voltage from any one of the second pads of the second pad portion PDA2.

The first pad portion PDA1 may be disposed on the upper side of the display panel 100. The first pad portion PDA1 may include first pads connected to an external circuit board.

The second pad portion PDA2 may be disposed on the lower side of the display panel 100. The second pad portion PDA2 may include second pads to be connected to an external circuit board. The second pad portion PDA2 may be omitted.

Figure 3:
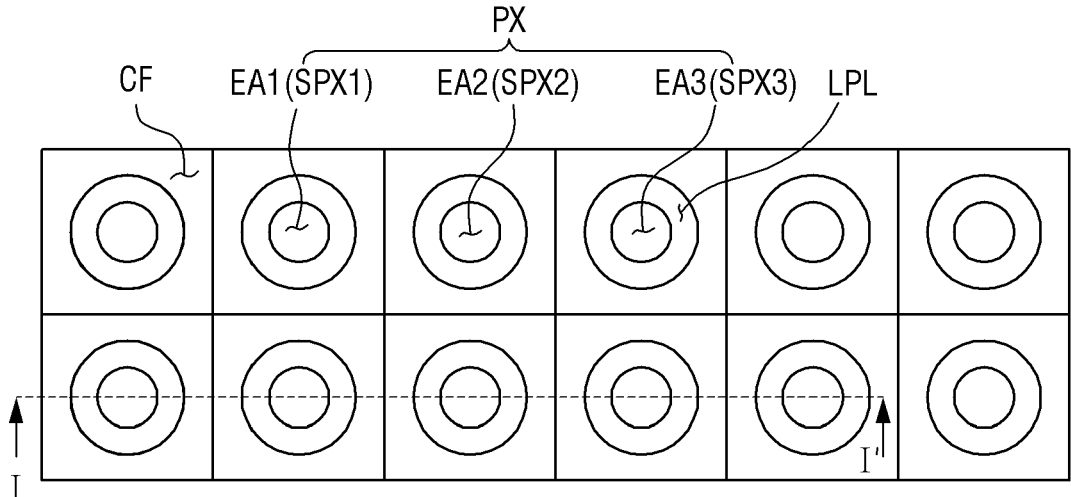
FIG. 3 is a schematic layout view illustrating pixels of a display panel of area B of FIG. 2.
Figure 3:
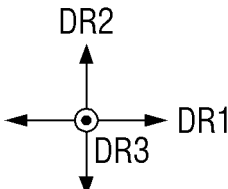
Figure 4:
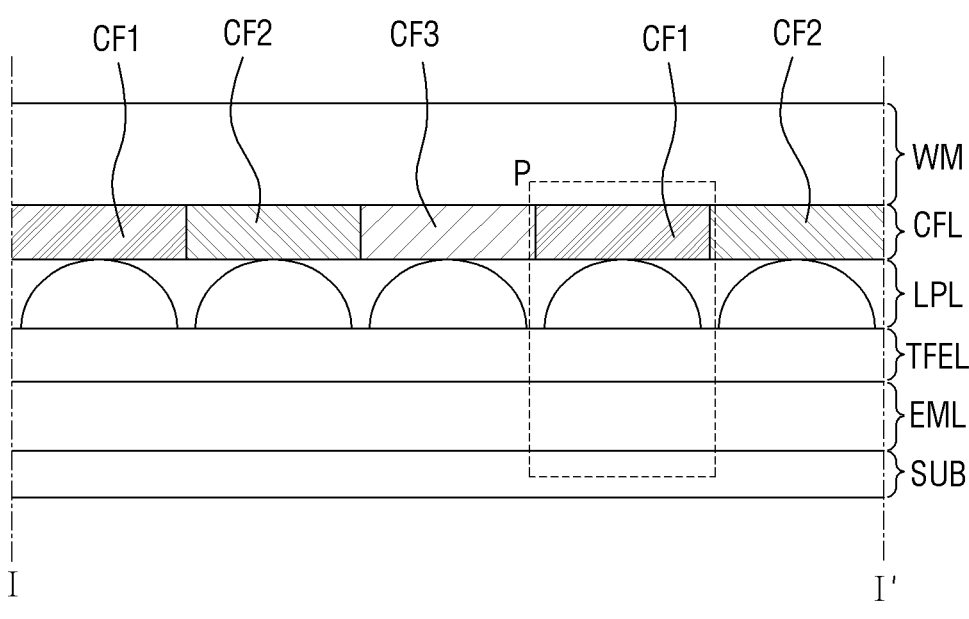
FIG. 4 is a schematic cross-sectional view illustrating an example of a display panel taken along line I-I' of FIG. 3.
Figure 4:
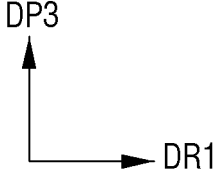

FIG. 3 is a schematic layout view illustrating pixels of a display panel of area B of FIG. 2, and FIG. 4 is a schematic cross-sectional view illustrating an example of a display panel taken along line I-I' of FIG. 3.

Referring to FIGS. 3 and 4, the display device 10 may include a substrate SUB, an organic light emitting element layer EML, an encapsulation layer TFEL, a light control pattern layer LPL, a color filter layer CFL, and a window WM.

For example, the substrate SUB may be a silicon wafer substrate as a semiconductor circuit substrate. The substrate SUB may be made of (or include) monocrystalline silicon. However, the embodiments are not limited thereto. The substrate may be made of one or more various materials.

The substrate may include light emitting areas, for example, first light emitting areas EA1, second light emitting areas EA2, and third light emitting areas EA3.

The first light emitting areas EA1, second light emitting areas EA2, and third light emitting areas EA3 may be alternately arranged in the first direction DR1. The first, second and third light emitting areas EA1, EA2, EA3 may include a first, second, and third sub-pixels SPX1, SPX2, SPX3. For example, the first light emitting areas EA1, the second light emitting areas EA2, and the third light emitting areas EA3 may be disposed in the order of the first light emitting area EA1, the second light emitting area EA2, and the third light emitting area EA3 in the first direction DR1.

In FIG. 3, each of the light emitting areas EA1, EA2, and EA3 may have a circular planar shape. However, embodiments of the specification are not limited thereto. For example, each of the light emitting areas EA1, EA2, and EA3 may have a polygonal planar shape such as a square or an elliptical planar shape.

In the organic light emitting element layer EML, in case that the white organic light emitting layer is formed of (or includes) a low molecular weight organic material, a hole transport layer, a hole injection layer, an electron transport layer, and an electron injection layer may be stacked. In addition, various layers may be stacked as needed. In case that the white organic light emitting layer of the organic light emitting element layer EML is formed of a polymer organic material, only the hole transport layer may be included around the white organic light emitting layer.

The encapsulation layer TFEL may be disposed on the organic light emitting element layer EML. The encapsulation layer TFEL may prevent penetration of oxygen or moisture into the organic light emitting element layer EML. To this end, the encapsulation layer TFEL may comprise at least one inorganic film. The inorganic layer may be a silicon nitride layer, a silicon oxy nitride layer, a silicon oxide layer, a titanium oxide layer, or an aluminum oxide layer, but is not limited thereto. In addition, the encapsulation layer TFEL may protect the light emitting element layer EML from foreign substances such as dust. To this end, the encapsulation layer TFEL may comprise at least one organic film. The organic layer may be an acrylic resin, an epoxy resin, a phenolic resin, a polyamide resin, a polyimide resin, or a combination thereof but is not limited thereto.

The encapsulation layer TFEL may be disposed in both the display area (e.g., DA of FIG. 1) and the non-display area (e.g., NDA of FIG. 1). Specifically, the encapsulation layer TFEL may be disposed to cover the organic light emitting element layer EML of the display area DA and the non-display area NDA, and cover a thin film transistor layer in substrate SUB of the non-display area NDA.

The light control pattern layer LPL may be disposed on the encapsulation layer TFEL.

The light control pattern layer LPL may be a layer for controlling the traveling direction of light so that light traveling in a diagonal direction rather than to the upper direction (Z-axis direction) of the display panel 100 among light of the organic light emitting element layer EML is controlled to travel to the upper direction (Z-axis direction) of the display panel 100.

The color filter layer CFL may be disposed on the light control pattern layer LPL.

The color filter layer CFL may include color filters CF (e.g., CF1, CF2, and CF3) of different first color, second color, and third color, respectively, formed in locations corresponding to the first light emitting area EA1, the second light emitting area EA2, and the third light emitting area EA3, respectively.

The color filters CF1, CF2, and CF3 may include first color filters CF1, second color filters CF2, and third color filters CF3.

Each of the first color filters CF1 may be disposed on the light control pattern layer LPL in the first light emitting area EA1. Each of the first color filters CF1 may transmit the first light and absorb or block other light, e.g., the second light and the third light. For example, each of the first color filters CF1 may transmit light in a blue wavelength band and may absorb or block light in a green and a red wavelength band. Therefore, each of the first color filters CF1 may transmit blue light in white light emitted from the organic light emitting element layer EML. Accordingly, each of the first light emitting areas EA1 may emit the first light. The first light may be light of any color, e.g., at least one of blue, red, and green light. In an embodiment, the first light may be blue light.

Each of the second color filters CF2 may be disposed on the light control pattern layer LPL in the second light emitting area EA2. In addition, each of the second color filters CF2 may transmit the second light and absorb or block other lights, e.g., the first light and the third light. For example, each of the second color filters CF2 may transmit light in a green wavelength band and absorb or block light in a blue and a red wavelength band. Therefore, each of the second color filters CF2 may transmit light of green wavelength band in the white light emitted from the organic light emitting element layer EML and absorb or block the third light corresponding to the blue wavelength band. Accordingly, each of the second light emitting areas EA2 may emit the second light. The second light may be light of any color, e.g., another one of blue, red, and green light. In an embodiment, the second light may be a green light.

Each of the third color filters CF3 may be disposed on the light control pattern layer LPL in the third light emitting area EA3. In addition, each of the third color filters CF3 may transmit the third light and absorb or block other lights, e.g., the first light and the second light. For example, each of the third color filters CF3 may transmit light of red wavelength band in the white light emitted from the organic light emitting element layer EML and absorb or block light in a blue and green wavelength band. Accordingly, each of the third light emitting areas EA3 may emit the third light. The third light may be light of any color, e.g., the other one of blue, red, and green light. In an embodiment, the third light may be red light.

An optically transparent window WM may be disposed on the color filter layer CFL.

The window WM may be attached to the color filter layer CFL by a transparent adhesive such as an optically clear adhesive film (OCA).

Figure 5:
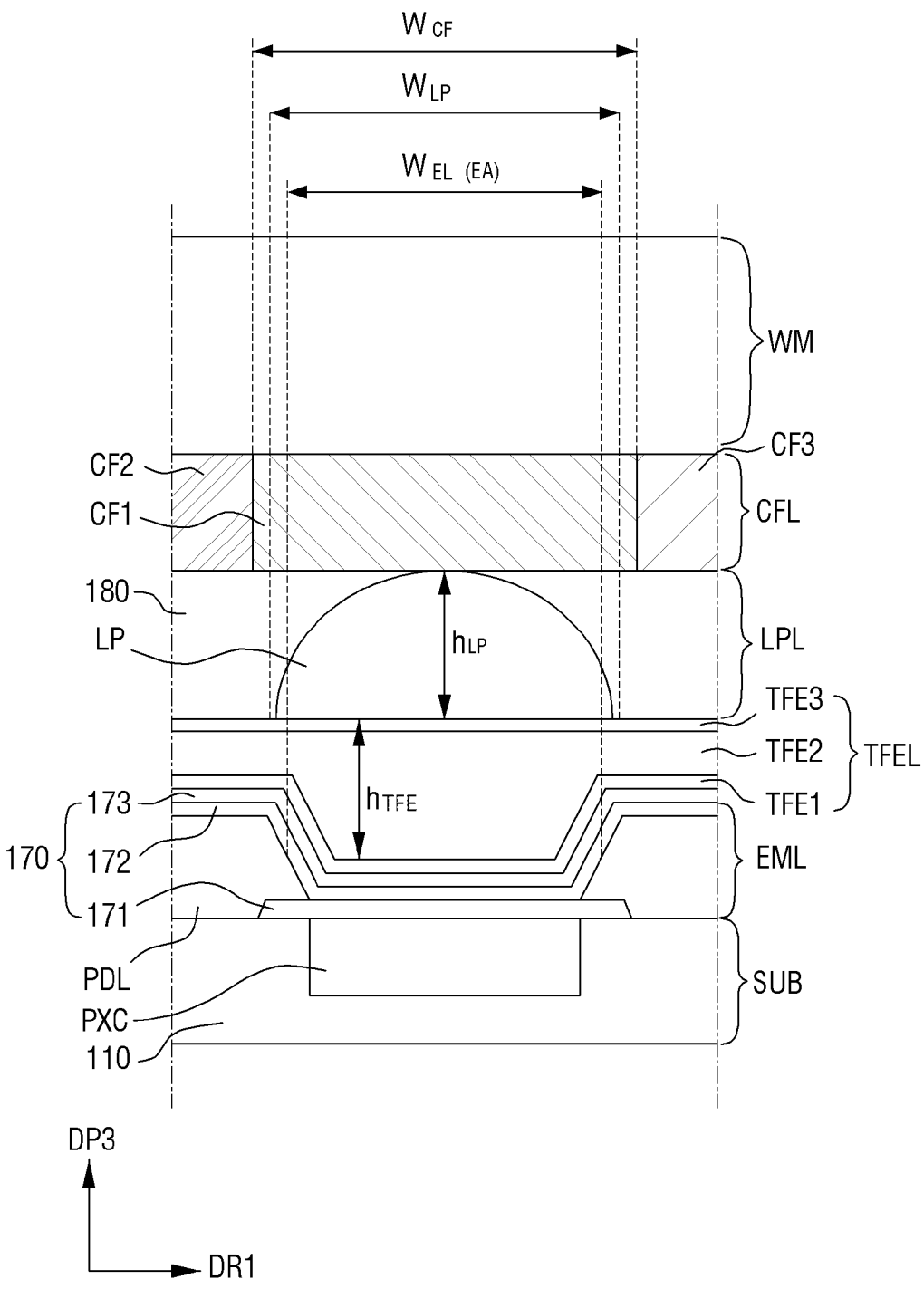
FIG. 5 is a schematic enlarged cross-sectional view illustrating area P of FIG. 4 in more detail.
Figure 6:
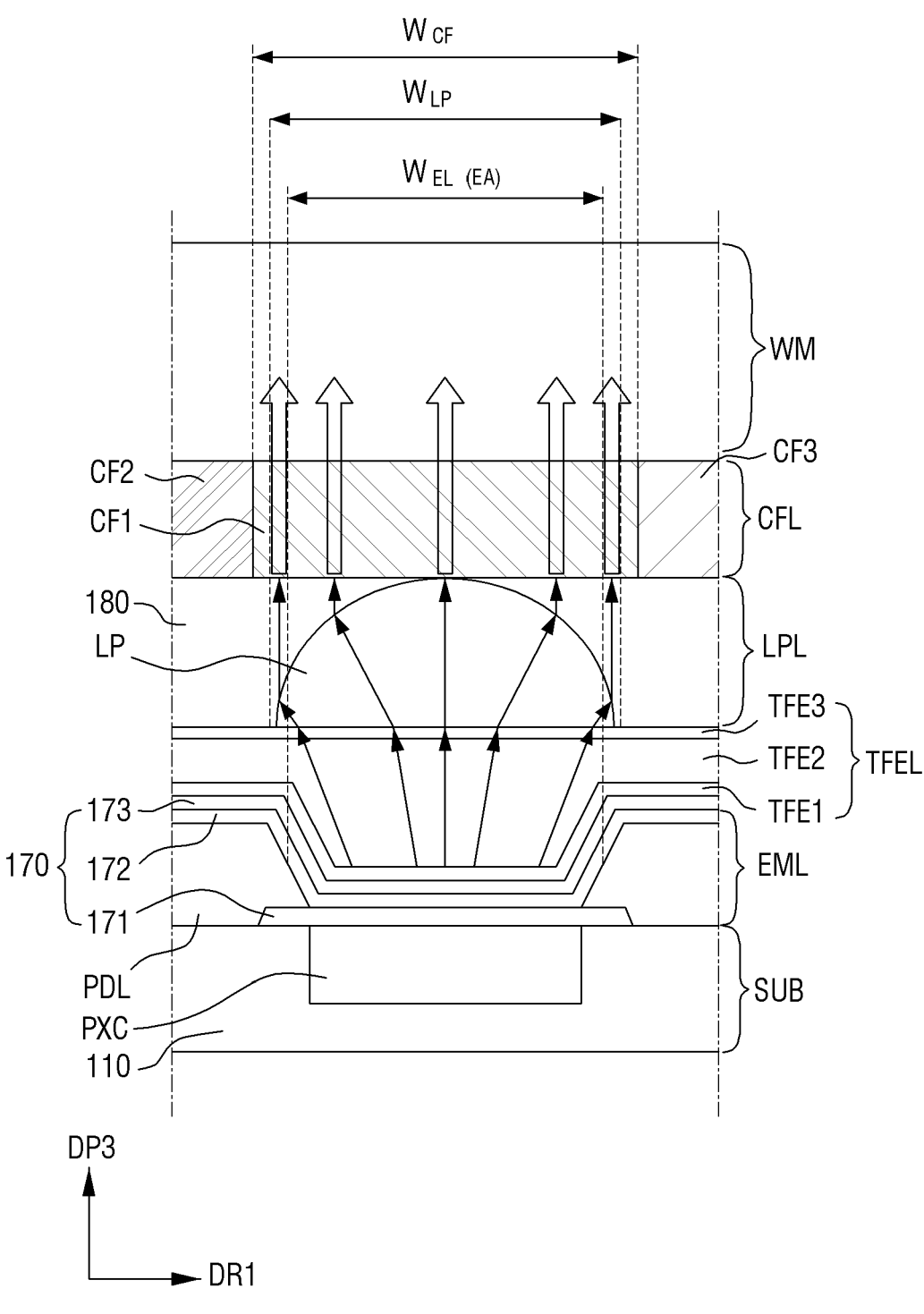
FIG. 6 is a schematic view for describing a method of controlling a traveling direction of light by a light control pattern layer in FIG. 5.

FIG. 5 is a schematic enlarged cross-sectional view illustrating area P of FIG. 4 in more detail, and FIG. 6 is a schematic view for describing a method of controlling a traveling direction of light by a light control pattern layer in FIG. 5.

The substrate SUB may include a base substrate 110 and pixel circuit units or pixel circuit parts (e.g., PXC of FIG. 5). The base substrate 110 may be a silicon substrate. Each of the pixel circuit units PXC may be disposed on the base substrate 110. Each of the pixel circuit units PXC may include a complementary metal-oxide semiconductor (CMOS) circuit formed by the semiconductor process. Each of the pixel circuit units PXC may include at least one transistor formed by the semiconductor process. In addition, each of the pixel circuit units PXC may further include at least one capacitor formed by, e.g., a semiconductor manufacturing process.

The pixel circuit units PXC may be disposed in the display area DA. Each of the pixel circuit units PXC may be connected to a first electrode 171 of the organic light emitting element layer EML, which will be described below. Each of the pixel circuit units PXC may apply a pixel voltage or an anode voltage to the first electrode 171.

The organic light emitting element layer EML may be disposed on the substrate SUB. The organic light emitting element layer EML may include organic light emitting elements 170 and a pixel defining layer PDL.

Each of the organic light emitting elements 170 may include the first electrode 171, an organic light emitting layer 172, and a second electrode 173.

The first electrode 171 may be formed on the pixel circuit unit PXC. In a top emission structure in which light is emitted toward the second electrode 173 when viewed with respect to the organic light emitting layer 172, the first electrode 171 may be formed of a metal material having high reflectivity such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). The APC alloy is an alloy of silver (Ag), palladium (Pd), and copper (Cu).

The pixel defining layer PDL may serve as a pixel defining layer defining a sub-pixel area. The pixel defining layer PDL may be formed to cover an edge of the first electrode 171. The pixel defining layer PDL may be formed of an organic layer such as acryl resin, epoxy resin, phenolic resin, polyamide resin, polyimide resin and the like, or a combination thereof. In a modified example, the pixel defining layer PDL may include an opaque material capable of blocking light.

Each of the sub-pixels represents a region in which the first electrode 171, the organic light emitting layer 172, and the second electrode 173 are sequentially stacked and holes from the first electrode 171 and electrons from the second electrode 173 are coupled to each other in the organic light emitting layer 172 to emit light. Each of the sub-pixels may include the organic light emitting element 170.

The organic light emitting layer 172 may be disposed on the first electrode 171 and the pixel defining layer PDL.

In case that the organic light emitting layer 172 is formed of a low molecular weight organic material, the organic light emitting layer 172 may include a hole transport layer, a light emitting layer, and an electron transport layer. In addition, various layers may be stacked as needed. In case that the organic light emitting layer 172 is formed of a polymer organic material, only the hole transport layer may be included around the organic light emitting layer 172.

For example, in case that a voltage (e.g., a predetermined or selectable voltage) is applied to the first electrode 171 and a cathode voltage is applied to the second electrode 173 through the pixel circuit units PXC, holes and electrons move to the organic light emitting layer 172 respectively through the hole transport layer and the electron transport layer and combine together in the organic light emitting layer 172 to emit light.

The organic light emitting layer 172 may emit white light. In this case, the first light emitting area EA1 of the first sub-pixels may overlap color filter layers of the first color, the second light emitting area EA2 of the second sub-pixels may overlap color filter layers of the second color, and the third light emitting area EA3 of the third sub-pixels may overlap color filter layers of the third color.

The second electrode 173 may be formed on the organic light emitting layer 172. The second electrode 173 may be formed to cover the organic light emitting layer 172. The second electrode 173 may be a common layer formed in common with respect to the sub-pixels.

In the top emission structure, the second electrode 173 may be made of a transparent conductive material (TCO) capable of transmitting light, such as ITO or IZO, or a semi-transmissive conductive material such as magnesium (Mg), silver (Ag) or an alloy of Mg and Ag. In case that the second electrode 173 is made of a semi-transmissive conductive material, the light output efficiency may be increased by a microcavity.

The encapsulation layer TFEL is formed on the organic light emitting element layer EML. The encapsulation layer TFEL may include a first inorganic encapsulation layer TFE1, an organic encapsulation layer TFE2, and a second inorganic encapsulation layer TFE3.

The first inorganic encapsulation layer TFE1 may be disposed on the second electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFEL and the second inorganic encapsulation layer TFE3 may be formed of multiple layers in which one or more inorganic layers of a silicon nitride layer, a silicon oxynitride layer, a silicon oxide layer, a titanium oxide layer and an aluminum oxide layer are alternately stacked.

The organic encapsulation layer TFE2 may be made of acryl resin, epoxy resin, phenolic resin, polyamide resin, polyimide resin, etc.

The light control pattern layer LPL is disposed between the encapsulation layer TFEL and the color filter layer CFL.

The light control pattern layer LPL is disposed on the second inorganic encapsulation layer TFE3. A light control pattern LP may overlap the organic light emitting layer 172. The light control pattern layer LPL may enhance the straightness of light emitted from the organic light emitting layer 172. For example, the light control pattern layer LPL may control traveling direction of light so that the light traveling toward the color filter which does not overlap the first light emitting area among light from the organic light emitting layer 172 of the first light emitting area to travel toward the color filter which overlaps the first light emitting area. Color mixing of light may be prevented by the light control pattern layer LPL. The light control pattern layer LPL may include the light control pattern LP and a low refractive index planarization layer 180.

The light control pattern LP may be disposed between the second inorganic encapsulation layer TFE3 and the color filter layer CFL, and may have a narrower width toward the color filter layer CFL. The light control pattern LP may have a convex lens shape convexly protruding from the upper surface of the encapsulation layer TFEL. For example, the light control pattern LP may have a circular shape in plan view. For example, the light control pattern LP may have a hemispherical or semi-elliptical protruding shape.

The light control pattern LP may be made of an acrylic resin, which is a transparent organic material, and may be formed on the encapsulation layer TFEL through a photo process or an imprinting process.

The light control pattern LP may have a higher refractive index than the encapsulation layer TFEL.

The low refractive index planarization layer 180 may flatten steps between the light control patterns LP. The low refractive index planarization layer 180 may be formed to not cover the uppermost portions of the light control patterns LP.

The low refractive index planarization layer 180 may be formed of an organic film such as acryl resin, epoxy resin, phenolic resin, polyamide resin, polyimide resin, or a combination thereof.

The low refractive index planarization layer 180 may have a lower refractive index than the light control pattern LP. The low refractive index planarization layer 180 may have the same refractive index as that of the encapsulation layer TFEL.

In an embodiment, the refractive index of the second inorganic encapsulation layer TFE3 may be in a range of about 1.6 to about 1.75, and the refractive index of the light control pattern LP may be higher than the refractive index of the second inorganic encapsulation layer TFE3 and the refractive index of the light control pattern LP may be in a range of about 1.7 to about 2.5. The refractive index of the low refractive index planarization layer 180 may be lower than that of the light control pattern LP, and the refractive index of the low refractive index planarization layer 180 may be in a range of about 1.6 to about 1.75.

A width $W_{LP}$ of the light control pattern LP in a sub-pixel area may be wider than a width $W_{EL}$ of the light emitting area and narrower than a width $W_{CF}$ of the color filter. For example, the ratio of the width $W_{EL}$ of the light emitting area, the width $W_{LP}$ of the light control pattern LP, and the width $W_{CF}$ of the color filter may be about 1:1 to 1.5:1.2 to 1.6. Here, the width $W_{LP}$ of the light control pattern LP may be the width $W_{LP}$ of the cross section of the light control pattern LP contacting the second inorganic encapsulation layer TFE3. For example, the width $W_{LP}$ of the light control pattern LP may be the widest width among the widths $W_{LP}$ of the light control pattern LP.

The ratio of width $W_{LP}$ of the light control pattern LP and a height $h_{LP}$ of the light control pattern LP may be about 1:0.5 to 2.

The lower a height $h_{TFE}$ of the encapsulation layer TFEL, the better it is to improve the light condensing property. However, in case that the height $h_{TFE}$ of the encapsulation layer TFEL is excessively low, it cannot function as the encapsulation layer TFEL that prevents moisture permeation.

Accordingly, the ratio of the height $h_{TFE}$ of the encapsulation layer TFEL, a width WPDL of the pixel defining layer, and the width $W_{CF}$ of the color filter for improving the linearity of the light emitting area while performing the role of the encapsulation layer TFEL may be about 1:0.5 to 2:2 to 5.

One surface of the light control pattern LP may contact the second inorganic encapsulation layer TFE3 and another surface corresponding to one surface may contact the color filter layer CFL.

As shown in FIG. 6, light emitted from the organic light emitting element 170 may be condensed without spreading through the light control pattern layer LPL.

Figure 7:
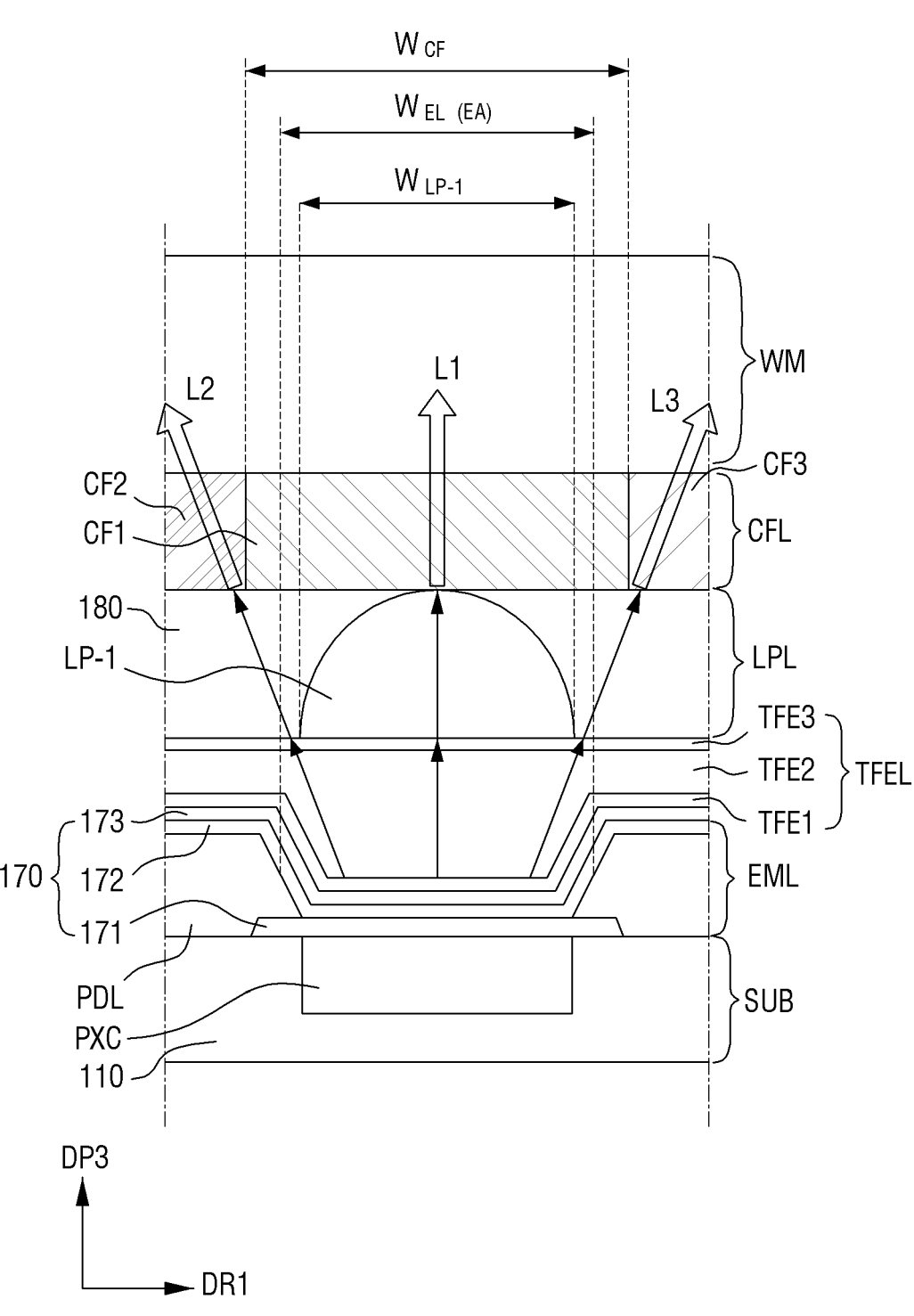
FIGS. 7 and 8 are schematic views for describing an example of a defect of light control pattern layer of FIG. 6.
Figure 8:
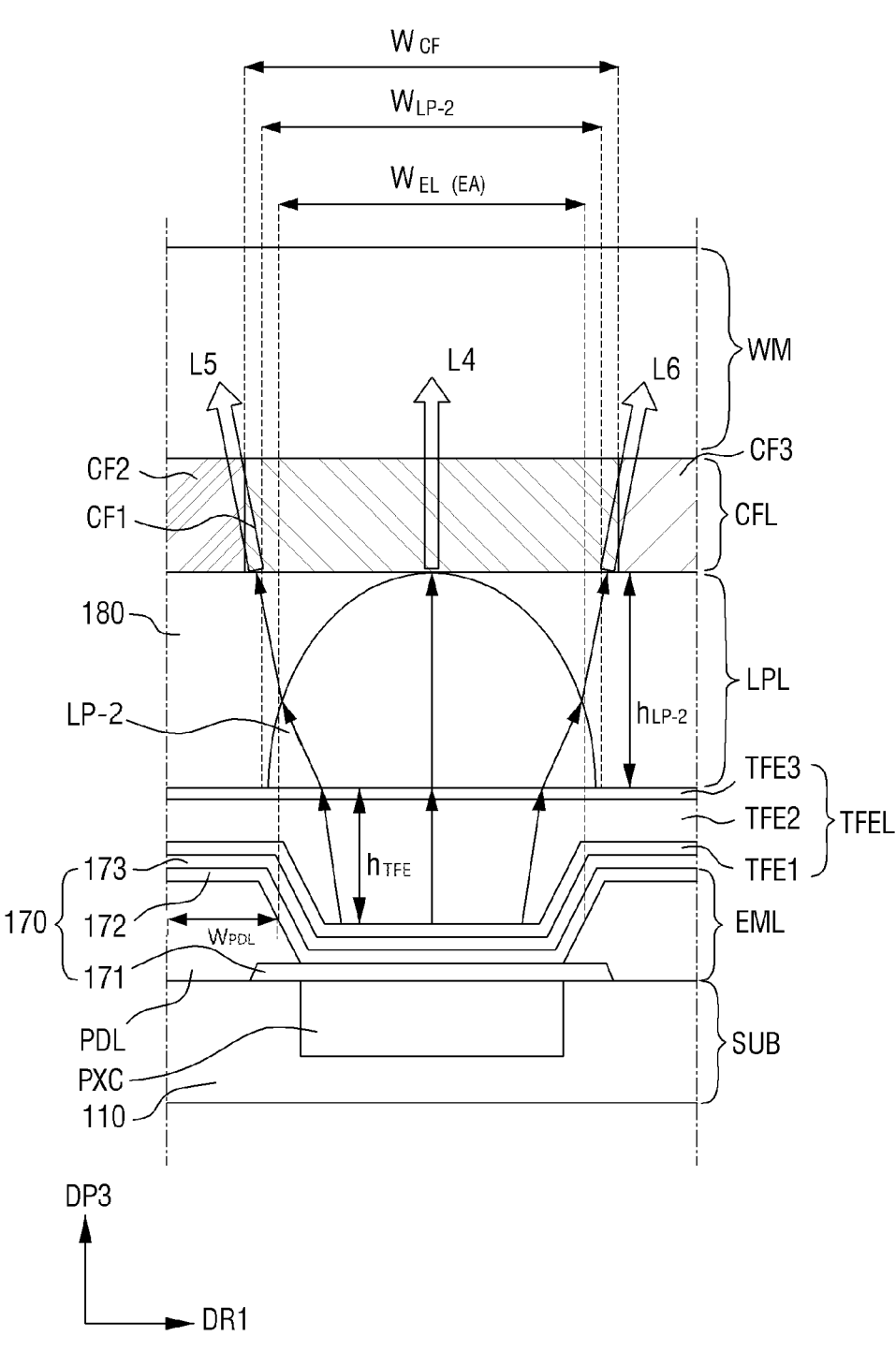

FIGS. 7 and 8 are schematic views for describing an example of a defect of light control pattern layer of FIG. 6.

Referring to FIG. 7, since only the width $W_{LP}$ of the light control pattern LP is different from that of FIG. 5, the different components will be mainly described.

Referring to FIG. 7, in case that a width $W_{LP\text{-}1}$ of a light control pattern LP-1 is narrower than the width $W_{EL}$ of the light emitting area of a sub-pixel, color mixing occurrence can be confirmed.

More specifically, the first light L1 emitted from a first sub-pixel SPX1 and traveling straight upward may pass through the light control pattern LP overlapping the first sub-pixel SPX1 to pass through the first color filter CF1. The second light L2 emitted from the first sub-pixel SPX1 and not traveling upwards but proceeding toward the second color filter CF2 adjacent to the first color filter CF1 may not pass through the light control pattern LP and may through the second color filter CF2. Similarly, the third light L3 emitted from the first sub-pixel SPX1 and not traveling upward but toward the third color filter CF3 adjacent to the first color filter CF1 may not pass through the light control pattern LP and may pass through the third color filter CF3. Accordingly, cross-talk occurs in case that the width $W_{LP\text{-}1}$ of the light control pattern LP-1 is formed to be narrower than the width $W_{EL}$ of the light emitting area of the sub-pixel.

Referring to FIG. 8, since only the height $H_{LP}$ of the light control pattern LP is different from that of FIG. 5, the different components will be mainly described.

Referring to FIG. 8, in case that a height $h_{LP\text{-}2}$ of a light control pattern LP-2 exceeds twice a width $W_{LP\text{-}2}$ of the light control pattern LP-2, for example, in case that the height $h_{LP\text{-}2}$ of the light control pattern LP-2 is about 2.5 times the width $W_{LP\text{-}2}$ of the light control pattern LP-2, color mixing occurrence can be confirmed.

More specifically, the fourth light LA emitted from the first sub-pixel SPX1 and traveling straight upward may pass through the light control pattern LP overlapping the first sub-pixel SPX1 to pass through the first color filter CF1. A fifth light L5 emitted from the first sub-pixel SPX1 and not traveling upwards but proceeding toward the second color filter CF2 adjacent to the first color filter CF1 may not travel upward the first color filter CF1 and may travel to the second color filter CF2. Similarly, a sixth light L6 emitted from the first sub-pixel SPX1 and not traveling upward but toward the third color filter CF3 adjacent to the first color filter CF1 may not travel upward the first color filter CF1 and may travel to the third color filter CF3. Accordingly, a cross-talk may occur.

Figure 9:
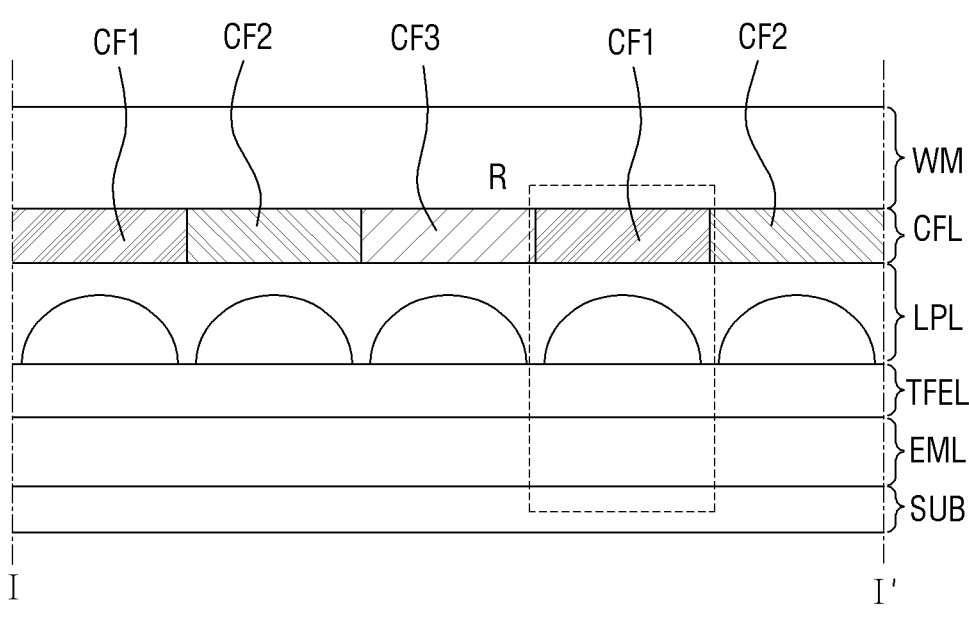
FIG. 9 is a schematic cross-sectional view illustrating another example of a display panel taken along line I-I' of FIG. 3.
Figure 9:
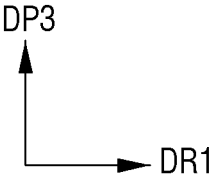
Figure 10:
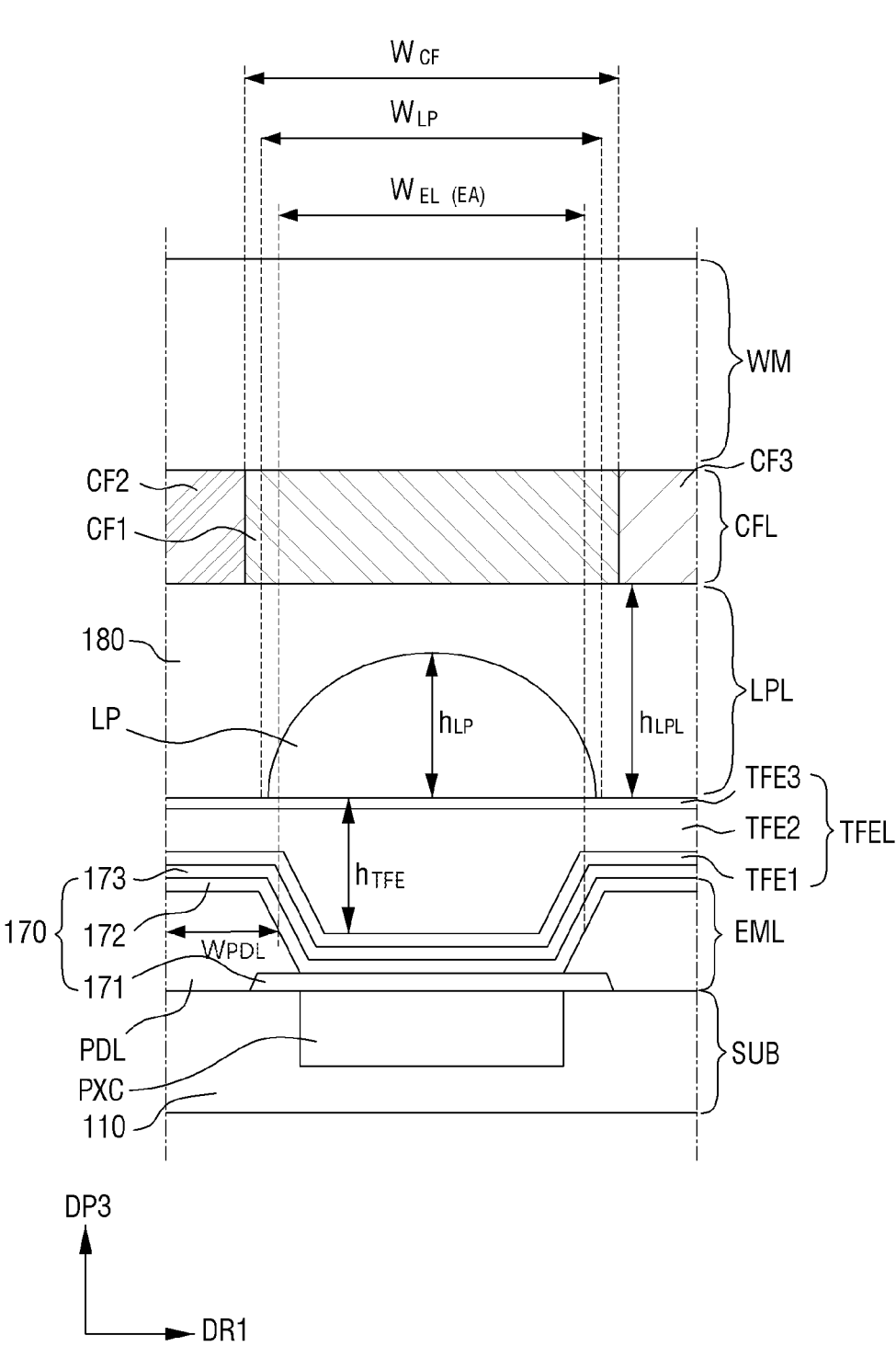
FIG. 10 is an enlarged cross-sectional view illustrating area R of FIG. 9 in more detail.

FIG. 9 is a schematic cross-sectional view illustrating another example of a display panel taken along line I-I' of FIG. 3. FIG. 10 is an enlarged cross-sectional view illustrating area R of FIG. 9 in more detail.

The embodiments shown in FIGS. 9 and 10 are different from the display panels of FIGS. 4 to 6 at least in that the light control pattern LP may not contact the color filter layer CFL. In addition, in the embodiments shown in FIGS. 9 and 10, the same configurations as the configurations described above with reference to FIGS. 4 to 6 will be briefly described or omitted.

The light control pattern layer LPL may be disposed between the encapsulation layer TFEL and the color filter layer CFL.

The light control pattern layer LPL may be disposed on the second inorganic encapsulation layer TFE3. The light control pattern LP may overlap the organic light emitting layer 172.

The light control pattern layer LPL may enhance the condensing property of light emitted from the organic light emitting layer 172. For example, the light control pattern layer LPL may control the light traveling toward the color filter layer CFL which does not overlap the first light emitting area among light from the organic light emitting layer 172 of the first light emitting area to travel toward the color filter layer CFL which overlaps the first light emitting area. Color mixing of light may be prevented by the light control pattern layer LPL.

The light control pattern layer LPL may include the light control pattern LP and the low refractive index planarization layer 180.

The light control pattern LP may be disposed between the second inorganic encapsulation layer TFE3 and the color filter layer CFL, and may have a narrower width toward the color filter layer CFL. The light control pattern LP may have a convex lens shape convexly protruding from the top surface of the encapsulation layer TFEL. For example, the light control pattern LP may have a circular shape when viewed from a plane or in a plan view. For example, the light control pattern LP may have a hemispherical or semi-elliptical protruding shape.

The light control pattern LP may be made of, e.g., an acrylic resin, which is a transparent organic material, and may be formed on the encapsulation layer TFEL through a photo process or an imprinting process.

The light control pattern LP may have a higher refractive index than the encapsulation layer TFEL.

The low refractive index planarization layer 180 may flatten steps between the light control patterns LP. The low refractive index planarization layer 180 may be formed to cover the uppermost portions of the light control patterns LP.

The low refractive index planarization layer 180 may be made of a transparent organic material such as acrylic resin.

The low refractive index planarization layer 180 may have a lower refractive index than that of the light control pattern LP. The low refractive index planarization layer 180 may have the same refractive index as that of the encapsulation layer TFEL.

In an embodiment, the refractive index of the second inorganic encapsulation layer TFE3 may be in a range of about 1.6 to about 1.75. The refractive index of the light control pattern LP may be higher than the refractive index of the second inorganic encapsulation layer TFE3 and the refractive index of the light control pattern LP may be in a range of about 1.7 to about 2.5. The refractive index of the low refractive index planarization layer 180 may be lower than that of the light control pattern LP, and the refractive index of the low refractive index planarization layer 180 may be in a range of about 1.6 to about 1.75.

The width $W_{LP}$ of the light control pattern LP in a sub-pixel area may be substantially equal to or wider than the width $W_{EL}$ of the light emitting area and narrower than the width $W_{CF}$ of the color filter. For example, the ratio of the width $W_{EL}$ of the light emitting area, the width $W_{LP}$ of the light control pattern LP, and the width $W_{CF}$ of the color filter may be about 1:1 to 1.5:1.2 to 1.6.

The ratio of the width $W_{LP}$ of the light control pattern LPL and a height $h_{LPL}$ of the light control pattern layer LPL may be about 1:0.5 to 2.

The height $h_{LP}$ of the light control pattern LP may be lower than the height $h_{LPL}$ of the light control pattern layer LPL. One surface of the light control pattern LP may contact the second inorganic encapsulation layer TFE3 and another surface corresponding to the one surface may not contact the color filter layer CFL.

The ratio of the height hTFE of the encapsulation layer TFEL, the width WPDL of the pixel defining layer, and the width Wer of the color filter may be about 1:0.5 to 2:2 to 5.

Figure 11:
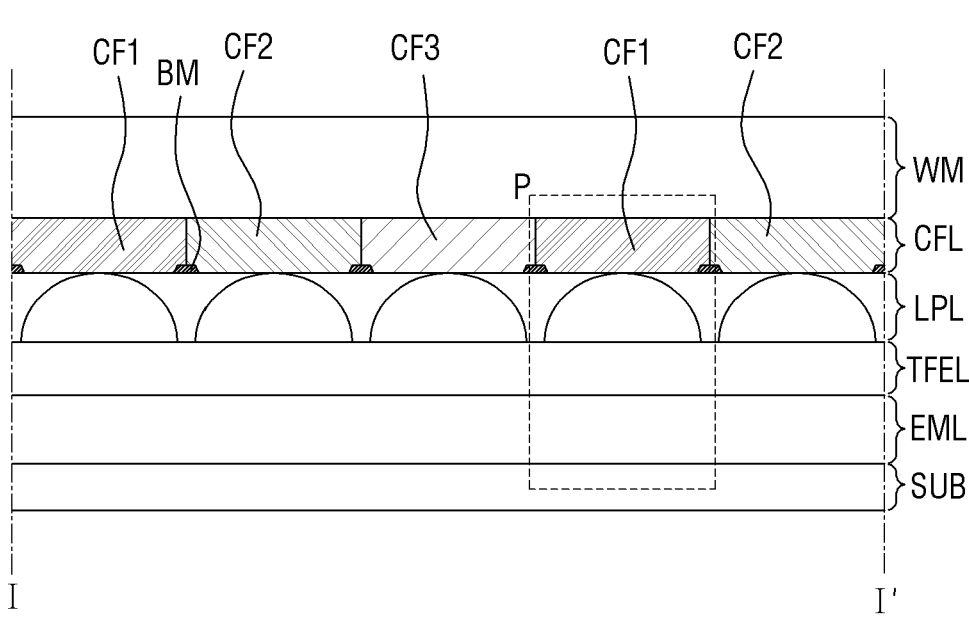
FIG. 11 is a schematic cross-sectional view illustrating another example of a display panel taken along line I-I' of FIG. 3.
Figure 11:
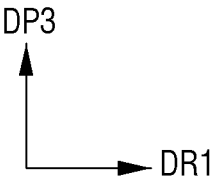
Figure 12:
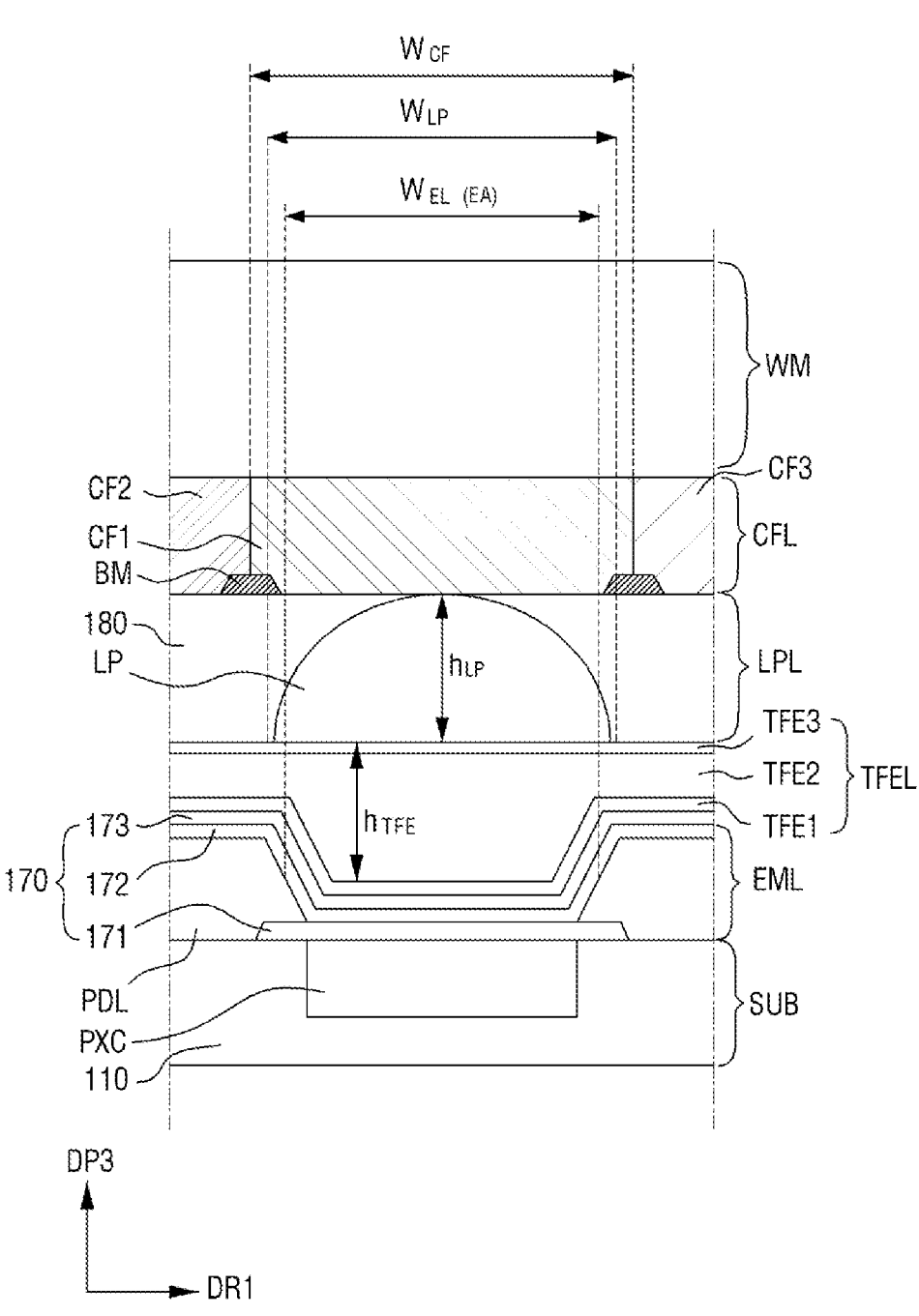
FIG. 12 is a schematic enlarged cross-sectional view illustrating area S of FIG. 10 in more detail.

FIG. 11 is a schematic cross-sectional view illustrating another example of a display panel taken along line I-I of FIG. 3. FIG. 12 is a schematic enlarged cross-sectional view illustrating area S of FIG. 10 in more detail.

Since the display panels of FIGS. 11 and 12 are the color filter layer CFL of the display panel of FIGS. 4 and 5 further including a light blocking pattern BM, the same components as those described above will be briefly described or omitted.

The color filter layer CFL may include the color filters CF1, CF2, and CF3 and the light blocking pattern BM. The light blocking pattern BM may be disposed on the boundaries between each of the color filters CF1, CF2, and CF3 on the light control pattern layer LPL. The light blocking pattern BM may not overlap the light emitting area. Therefore, travel of light emitted upward (Z direction) from the light emitting area may not be hindered or absorbed. In another modified embodiment, instead of the light blocking pattern BM formed of photosensitive resin, the color filters CF1, CF2, and CF3 may be layered on the boundaries of the color filters CF1, CF2, and CF3 to perform the light blocking function.

The light blocking pattern BM may be formed of a photosensitive resin capable of blocking light. For example, the light blocking pattern BM may include an inorganic black pigment such as carbon black or an organic black pigment. The light blocking pattern BM may have lower light transmittance than a light control pattern LP. The light transmittance of the light blocking pattern BM may be about 60% or less. Accordingly, even in case that some of the light not condensed in the light control pattern LP travels to the light blocking pattern BM, it may not pass through the light blocking pattern BM and may be reflected again. Therefore, the light blocking pattern BM may prevent color mixing between adjacent light emitting areas.

Figure 13:
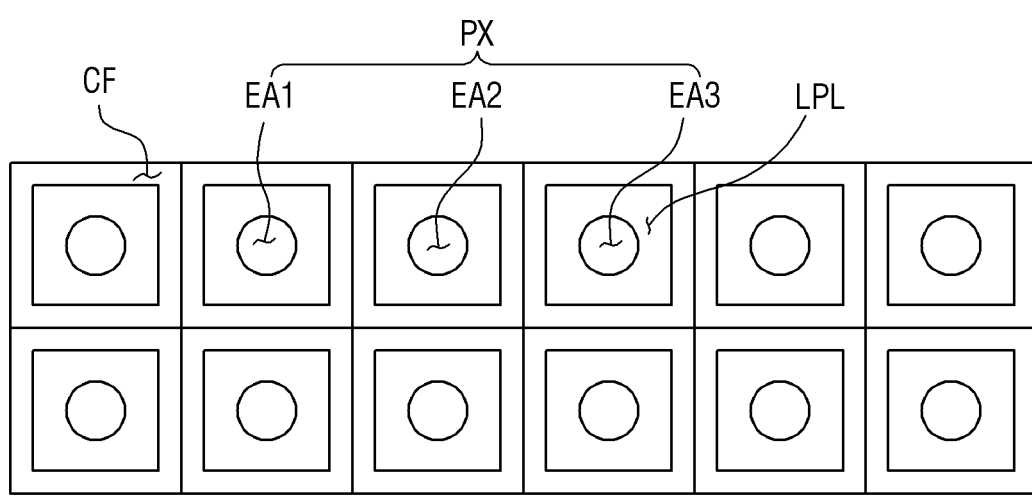
FIG. 13 is a schematic layout view illustrating pixels of a display panel of area B of FIG. 2 according to another embodiment.
Figure 13:
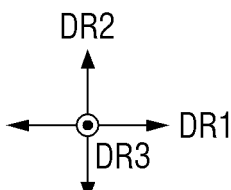
Figure 14:
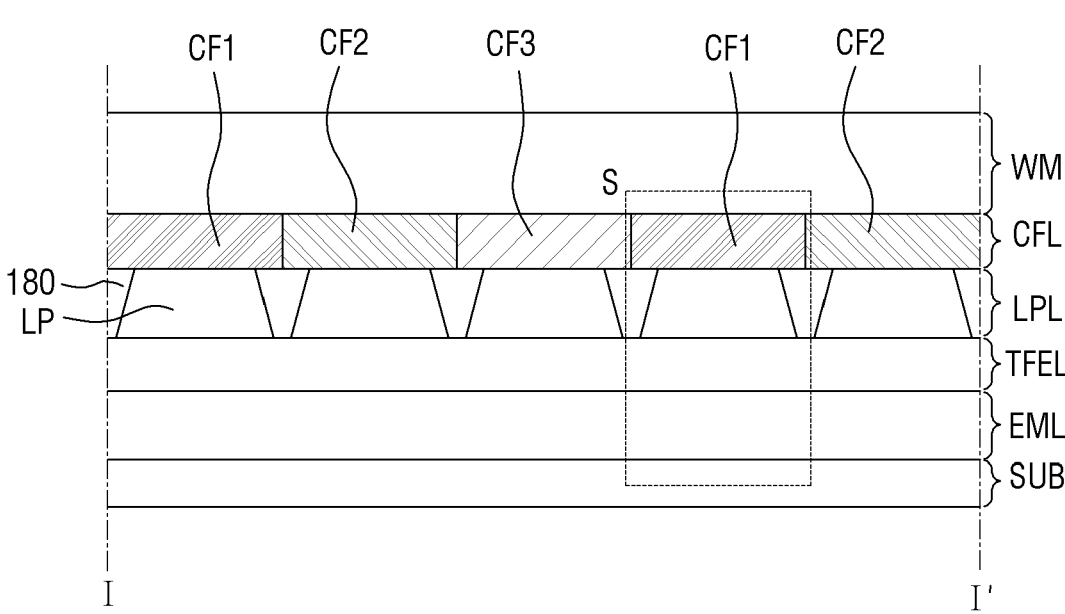
FIG. 14 is a schematic cross-sectional view illustrating an example of a display panel taken along line I-I' of FIG. 3.
Figure 14:
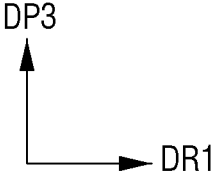
Figure 15:
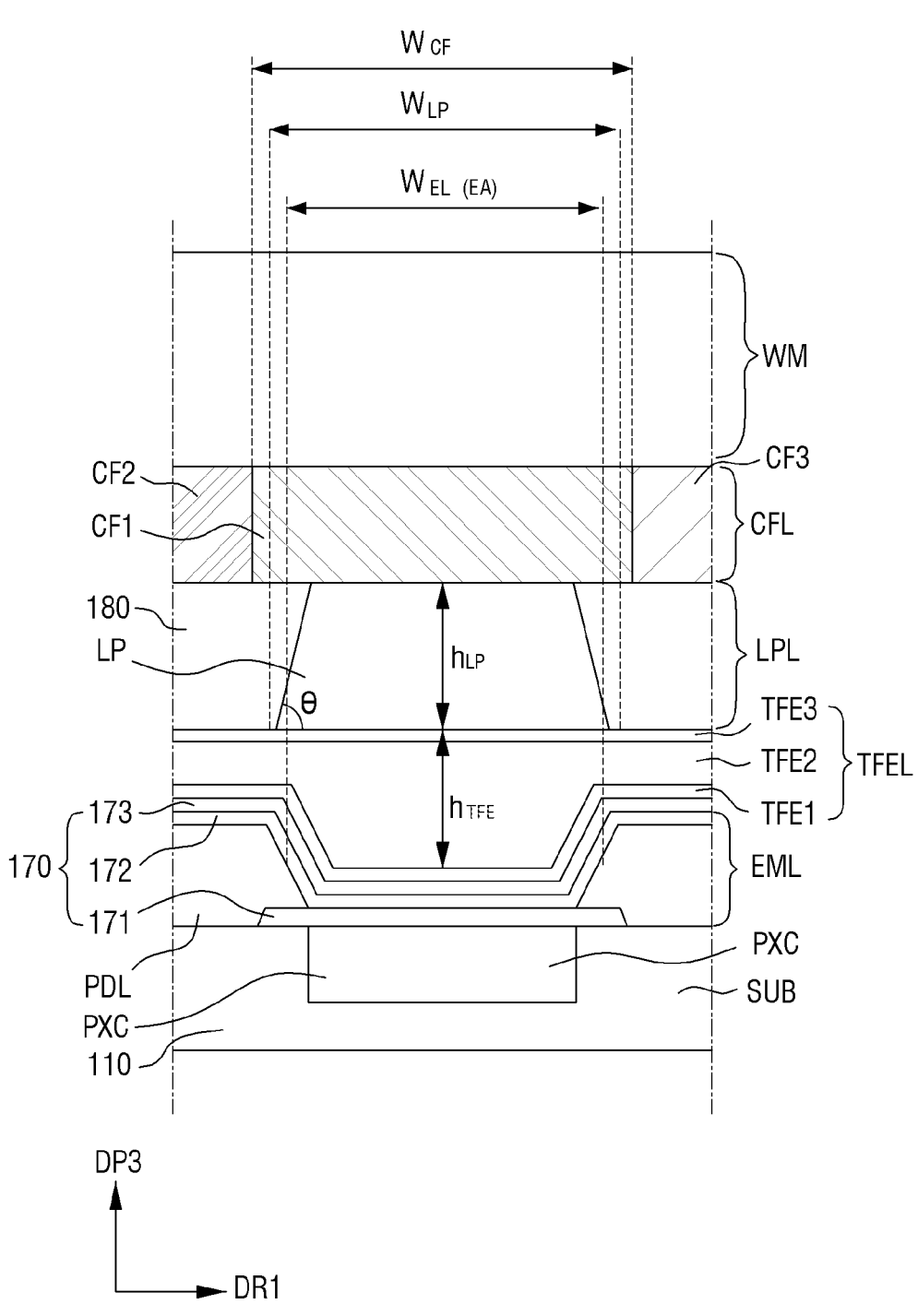
FIG. 15 is a schematic enlarged cross-sectional view illustrating area S of FIG. 14 in more detail.
Figure 16:
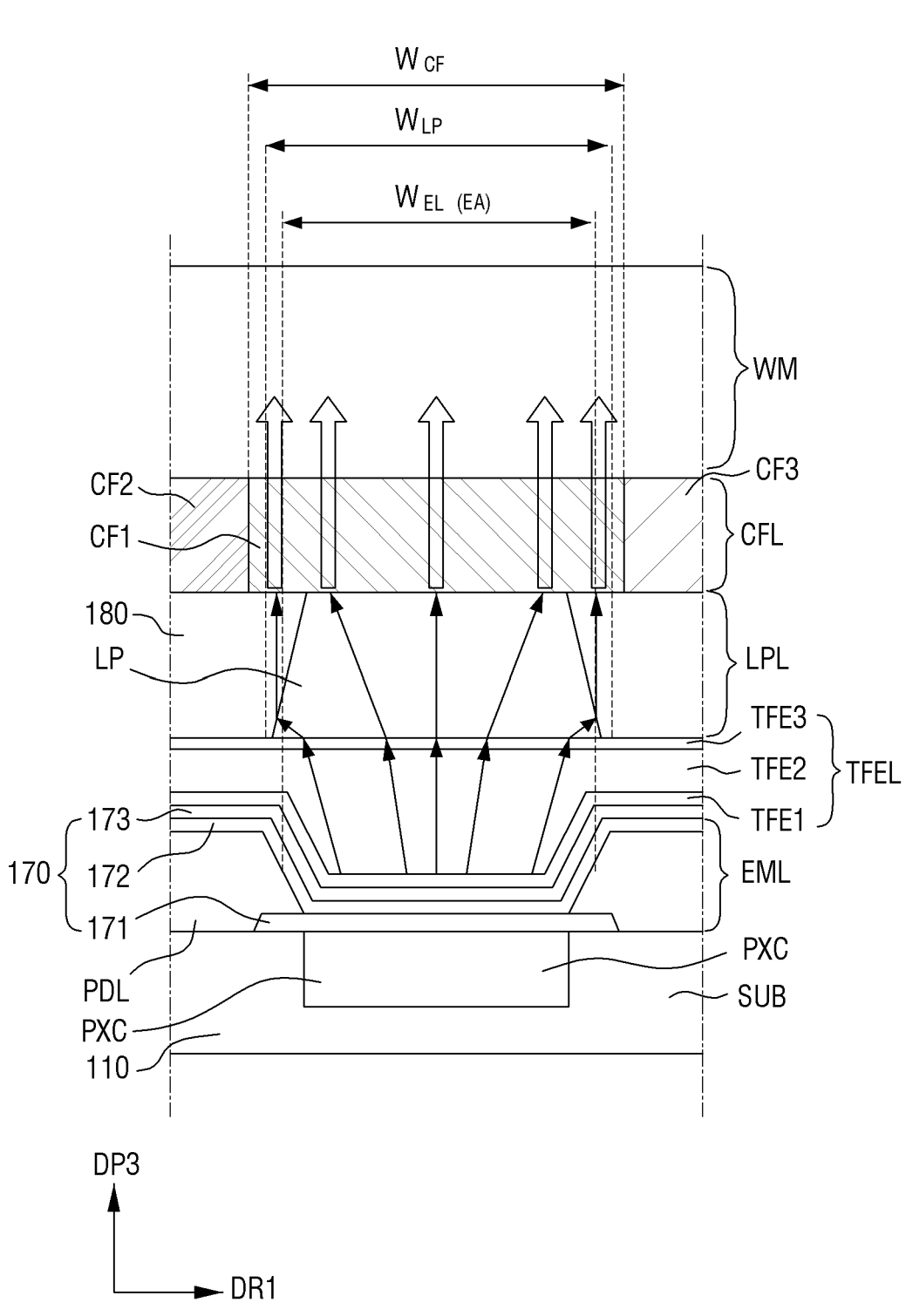
FIG. 16 is a schematic view for describing a method for controlling a traveling direction of light by a light control pattern layer in FIG. 15.

FIG. 13 is a schematic layout view illustrating pixels of a display panel of area B of FIG. 2 according to another embodiment, and FIG. 14 is a schematic cross-sectional view illustrating an example of a display panel taken along line I-I' of FIG. 3. FIG. 15 is a schematic cross-sectional view illustrating area S of FIG. 14 in more detail, and FIG. 16 is a schematic view for describing a method for controlling a traveling direction of light by a light control pattern layer in FIG. 15.

The embodiments of FIGS. 13 to 16 are different from the embodiments of FIGS. 3 to 6 at least in that the light control pattern LP has a frustrum shape. In the embodiments shown in FIGS. 13 to 16, the same configurations as the configurations described above with reference to FIGS. 3 to 6 will be briefly described or omitted.

The light control pattern layer LPL may be disposed between the encapsulation layer TFEL and the color filter layer CFL.

The light control pattern layer LPL may be disposed on the second inorganic encapsulation layer TFE3. The light control pattern LP may overlap the organic light emitting layer 172.

The light control pattern layer LPL may enhance the straightness of light emitted from the organic light emitting layer 172. For example, the light control pattern layer LPL may control traveling direction of light so that the light traveling toward the color filter which does not overlap the first light emitting area among light from the organic light emitting layer 172 of the first light emitting area to travel toward the color filter which overlaps the first light emitting area. Color mixing of light may be prevented by the light control pattern layer LPL. The light control pattern layer LPL may include the light control pattern LP and the low refractive index planarization layer 180.

The light control pattern LP may be disposed between the second inorganic encapsulation layer TFE3 and the color filter layer CFL, and may have a narrower width toward the color filter layer CFL. The light control pattern LP may have various shapes. For example the light control pattern LP may have a frustum shape. For example, the light control pattern LP may have a shape protruding toward the color filter layer CFL.

In the light control pattern LP, the angle θ of the inner inclined surface formed as the second inorganic encapsulation layer TFE3 and the light control pattern LP meet may be about 90 degrees or less, and in an embodiment, the angle θ of the inner inclined surface of the light control pattern LP may be in a range of about 45 degrees to about 70 degrees.

The light control pattern LP may be made of, e.g., an acrylic resin, which is a transparent organic material, and may be formed on the encapsulation layer TFEL through a photo process or an imprinting process.

The light control pattern LP may have a higher refractive index than the encapsulation layer TFEL.

The low refractive index planarization layer 180 may flatten steps between the light control patterns LP. The low refractive index planarization layer 180 may be formed to not cover the uppermost portions of the light control patterns LP.

The low refractive index planarization layer 180 may be formed of, e.g., an organic film such as acryl resin, epoxy resin, phenolic resin, polyamide resin, or polyimide resin.

The low refractive index planarization layer 180 may have a lower refractive index than that of the light control pattern LP. The low refractive index planarization layer 180 may have the same refractive index as that of the encapsulation layer TFEL.

In an embodiment, the refractive index of the second inorganic encapsulation layer TFE3 may be in a range of about 1.6 to about 1.75. The refractive index of the light control pattern LP may be higher than the refractive index of the second inorganic encapsulation layer TFE3 and the refractive index of the light control pattern LP may be in a range of about 1.7 to about 2.5. The refractive index of the low refractive index planarization layer 180 may be lower than that of the light control pattern LP, and the refractive index of the low refractive index planarization layer 180 may be in a range of about 1.6 to about 1.75.

The width $W_{LP}$ of the light control pattern LP in a sub-pixel area may be wider than a width $W_{EL}$ of the light emitting area and narrower than a width $W_{CF}$ of the color filter. For example, the ratio of the width $W_{EL}$ of the light emitting area, the width $W_{LP}$ of the light control pattern LP, and the width $W_{CF}$ of the color filter may be about 1:1 to 1.5:1.2 to 1.6. Here, the width $W_{LP}$ of the light control pattern LP may be the width $W_{LP}$ of the cross section of the light control pattern LP contacting the second inorganic encapsulation layer TFE3. For example, the width $W_{LP}$ of the light control pattern LP may be a width of the widest floor surface among the widths $W_{LP}$ of the light control pattern LP.

The width $W_{LP}$ of the light control pattern LP: the height $h_{LP}$ of the light control pattern LP may be about 1:0.5 to 2.

The lower a height $h_{TFE}$ of the encapsulation layer TFEL, the better it is to improve the light condensing property. However, in case that the height $h_{TFE}$ of the encapsulation layer TFEL is excessively low, it cannot function as the encapsulation layer TFEL that prevents moisture permeation.

Accordingly, the ratio of the height $h_{TFE}$ of the encapsulation layer TFEL, a width WPDL of the pixel defining layer, and the width $W_{CF}$ of the color filter for improving the linearity of the light emitting area while performing the role of the encapsulation layer TFEL may be about 1:0.5 to 2:2 to 5.

One surface of the light control pattern LP may contact the second inorganic encapsulation layer TFE3 and another surface facing the corresponding to one surface may contact the color filter layer CFL.

Figure 17:
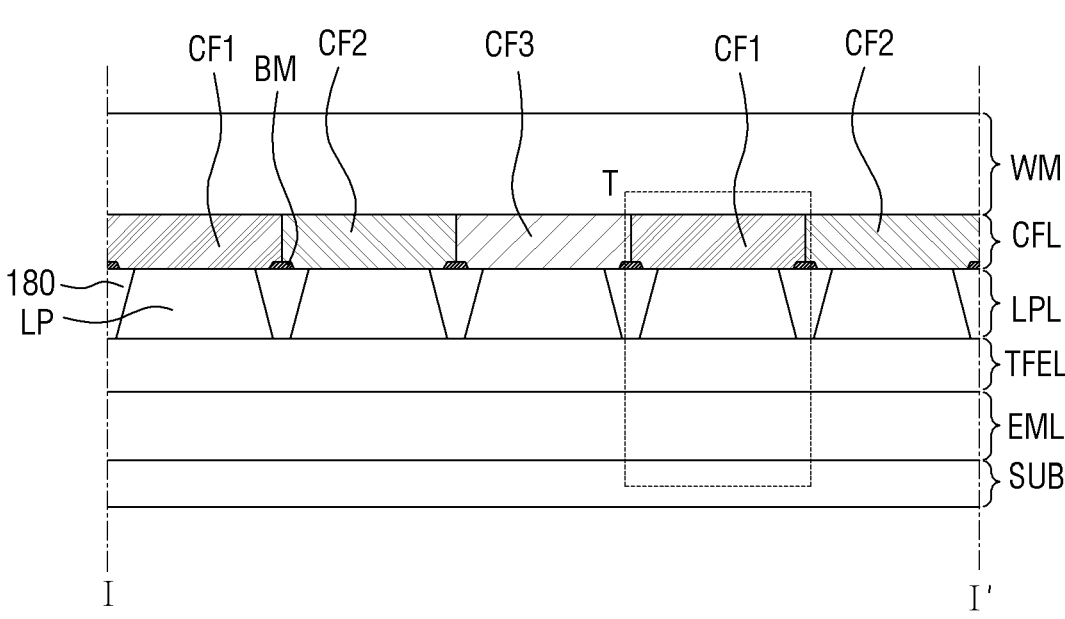
FIG. 17 is a schematic cross-sectional view illustrating still another example of a display panel taken along line I-I' of FIG. 3.
Figure 17:
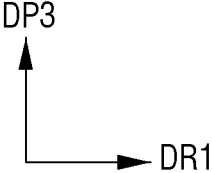
Figure 18:
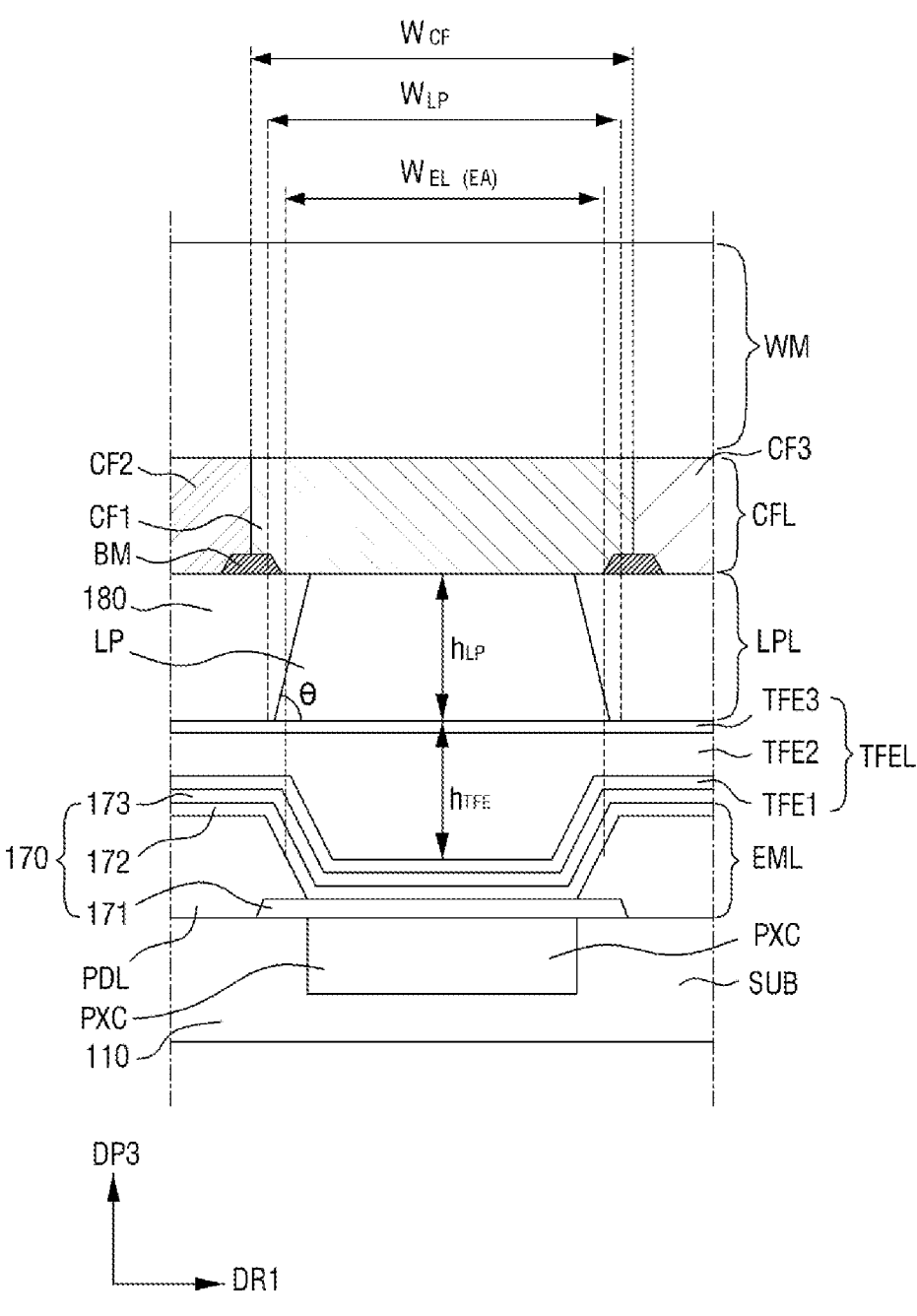
FIG. 18 is a schematic enlarged cross-sectional view illustrating area T of FIG. 17 in more detail.

FIG. 17 is a schematic cross-sectional view illustrating still another example of a display panel taken along line I-I' of FIG. 3. FIG. 18 is an enlarged cross-sectional view illustrating area T of FIG. 17 in more detail.

Since the display panels of FIGS. 17 and 18 are the color filter layer CFL of the display panel of FIGS. 14 and 15 further including a light blocking pattern BM, the same components as those described above will be briefly described or omitted.

The color filter layer CFL may include color filters CF1, CF2, and CF3 and a light blocking pattern BM. The light blocking pattern BM may be disposed on the boundary between each of the color filters CF1, CF2, and CF3 on the light control pattern layer LPL. The light blocking pattern BM may not overlap the light emitting area. Therefore, travel of light emitted upward (Z direction or DR3 direction) from the light emitting area may not hindered or absorbed.

The light blocking pattern BM may be formed of a photosensitive resin capable of blocking light. For example, the light blocking pattern BM may include an inorganic black pigment such as carbon black or an organic black pigment. The light blocking pattern BM may have lower light transmittance than a light control pattern LP. The light transmittance of the light blocking pattern BM may be about 60% or less. Accordingly, even in case that some of the light not condensed in the light control pattern LP travels to the light blocking pattern BM, it may not pass through the light blocking pattern BM and may be reflected again. Therefore, the light blocking pattern BM may prevent color mixing between adjacent light emitting areas.

In another modified embodiment, instead of the light blocking pattern BM formed of photosensitive resin, color filters CF1, CF2, and CF3 may be layered on the boundary of the color filters CF1, CF2, and CF3 to perform the light blocking function.

FIG. 19 is a schematic view illustrating as an example an augmented reality device including a display device according to an embodiment. FIG. 19 shows an augmented reality device 1 to which the display device 10 according to the embodiment described with reference to FIGS. 1 to 18 is applied.

Referring to FIG. 19, the augmented reality device 1 according to an embodiment may be a glasses-type device. The augmented reality device 1 according to an embodiment may include the display device 10, a left lens 10a, a right lens 10b, a support frame 20, temples 30a and 30b, a reflection member 40, and a display device storage 50.

Although FIG. 19 illustrates the augmented reality device 1 including the temples 30a and 30b, the augmented reality device 1 according to an embodiment may be applied to various devices, e.g., a head mounted display including a head mounted band that may be worn on a head, instead of the temples 30a and 30b. The augmented reality device 1 according to an embodiment is not limited to that shown in FIG. 19, and may be applied in various forms to various electronic devices.

The display device storage 50 may include the display device 10 and the reflection member 40. The image displayed on the display device 10 may be reflected by the reflection member 40 and provided to a user's right eye through the right lens 10b. Accordingly, the user can view the augmented reality image displayed on the display device 10 through the right eye.

FIG. 19 illustrates that the display device storage 50 is disposed at the end of the right side of a support frame 20, but the embodiment of the specification is not limited thereto. For example, the display device storage 50 may be disposed at the left end of the support frame 20, and in this case, the image displayed on the display device 10 may be reflected by the reflection member 40 and provided to a user's left eye through the left lens 10a. Accordingly, the user can view the augmented reality image displayed on the display device 10 through the left eye. Alternatively, the display device storage 50 may be disposed at both the left end and the right end of the support frame 20. In that case, the user can view the augmented reality image displayed on the display device 10 through both the left eye and the right eye.

Figure 20:
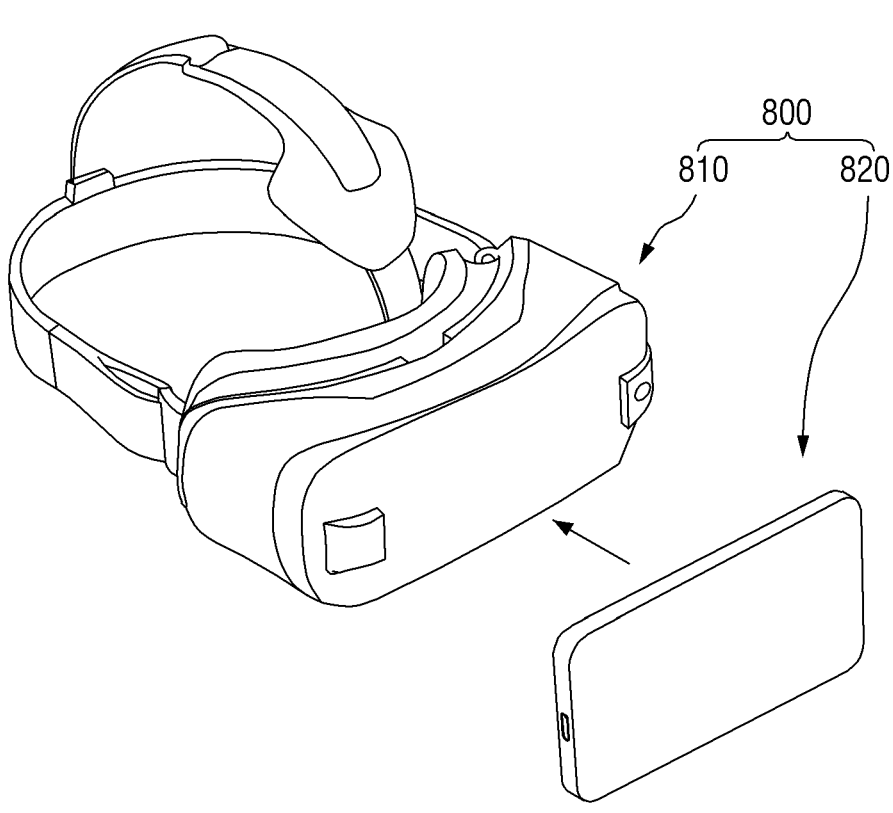
FIG. 20 is a schematic view illustrating a configuration of a head mounted display device according to an embodiment.

FIG. 20 is a view illustrating a configuration of a head mounted display device according to an embodiment.

Referring to FIG. 20, a head-mounted display device 800 according to an embodiment of the disclosure may include a head-mounted device 810 and a display device 820.

The head-mounted device 810 may be coupled with the display device 820. Here, the display device 820 may include a display panel that displays images. The display panel may include the display panel 100 having the light control pattern layer LPL described herein.

The head-mounted device 810 may include a connector for electrical connection to the display device 820 and a frame for physical connection. In addition, the head-mounted device 810 may include a cover for preventing an external shock and preventing the display device 820 from being detached.

The head-mounted device 810 may be coupled with the display device 820, and may provide VR (virtual reality), AR (augmented reality), MR (mixed reality), XR (extended reality), and/or SR (substitution reality) through the display device 820.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a substrate;
an organic light emitting element layer comprising:
    a first electrode;
    a second electrode; and
    an organic light emitting layer disposed between the first electrode and the second electrode and emitting light in a light emitting area;
an encapsulation layer covering the organic light emitting element layer;
a color filter layer disposed in the light emitting area and including a plurality of color filters having different colors;
a light control pattern layer disposed between the encapsulation layer and the color filter layer and including a light control pattern disposed on a light path of the organic light emitting layer; and
a planarization layer disposed on the light control pattern and below the color filter layer, wherein an uppermost portion of the light control pattern is exposed through the planarization layer.

2. The display device of claim 1, wherein
the light emitting area includes a first light emitting area, a second light emitting area, and a third light emitting area, and
the plurality of color filters includes:
    a color filter of a first color in the first light emitting area;
    a color filter of a second color in the second light emitting area; and
    a color filter of a third color in the third light emitting area.

3. The display device of claim 1, wherein the encapsulation layer includes:
an organic encapsulation layer; and
at least one inorganic encapsulation layer disposed on the organic light emitting element layer.

4. The display device of claim 1, wherein a refractive index of the planarization layer is less than a refractive index of the light control pattern.

5. The display device of claim 4, wherein
the refractive index of the encapsulation layer is in a range of about 1.6 to about 1.75,
the refractive index of the planarization layer is in a range of about 1.6 to about 1.75,
the refractive index of the light control pattern layer is in a range of about 1.7 to 2.5, and
the refractive index of the light control pattern layer is higher than the refractive index of the encapsulation layer and the refractive index of the planarization layer.

6. The display device of claim 1, wherein the width of the light control pattern becomes narrower toward the color filter layer.

7. The display device of claim 6, wherein the light control pattern is a convex lens shape.

8. The display device of claim 7, wherein the light control pattern has a frustrum shape.

9. The display device of claim 8, wherein one surface of the light control pattern contacts the encapsulation layer, and another surface of the light control pattern contacts the color filter layer.

10. The display device of claim 1, wherein a widest width of the light control pattern is narrower than a width of the light emitting area and wider than a width of the color filter.

11. The display device of claim 10, wherein the ratio of a width of the light emitting area, a width of the light control pattern, and a width of the color filter is about 1:1 to 1.5:1.2 to 1.6.

12. The display device of claim 1, wherein the ratio of a height of the light control pattern and the light control pattern is about 1:0.5 to 2.

13. The display device of claim 1, wherein the ratio of a height of the encapsulation layer, a width of a pixel defining layer, and a width of the color filter is about 1:0.5 to 2:2 to 5.

14. The display device of claim 1, wherein the color filter layer further comprises a light blocking pattern disposed in the boundaries of each of the plurality of color filters.

15. The display device of claim 1, wherein the substrate is a semiconductor circuit substrate.

16. A display device comprising:

a sub-pixel disposed on a substrate and including:

a first electrode;

an organic light emitting layer; and a second electrode;

a pixel defining layer defining the sub-pixels;

an encapsulation layer disposed on the pixel defining layer and the sub-pixels; and a light control pattern layer overlapping the sub-pixels, disposed on the encapsulation layer, and comprising a light control pattern disposed on a light path of the organic light emitting layer, wherein the light control pattern layer has a shape in which the width becomes greater toward the encapsulation layer, and the light control pattern layer has a refractive index higher than a refractive index of the encapsulation layer.

17. The display device of claim 16, wherein the encapsulation layer further includes:

a first inorganic encapsulation layer disposed on the organic light emitting element layer;

an organic encapsulation layer disposed on the first inorganic encapsulation layer; and a second inorganic encapsulation layer disposed on the organic encapsulation layer.

18. The display device of claim 17, wherein the refractive index of the second inorganic encapsulation layer is about 1.6 to 1.75, the refractive index of the light control pattern layer is about 1.7 to 2.5, and the refractive index of the light control pattern layer is higher than the refractive index of the second inorganic encapsulation layer.

19. The display device of claim 16, wherein the ratio of the height of the light control pattern and the width of the light control pattern is about 1:0.5 to 2.

20. The display device of claim 16, wherein the light control pattern has a convex lens shape or a frustrum shape.

21. A-head mounted display An electronic device comprising:

a display device;

a connector that electrically connects the display device; and a frame, wherein the display device comprises:

an organic light emitting element layer comprising:

a first electrode;

a second electrode; and an organic light emitting layer disposed between the first electrode and the second electrode and emitting light in a light emitting area;

an encapsulation layer covering the organic light emitting element layer;

a color filter layer disposed in the light emitting area and including a plurality of color filters having different colors;

a light control pattern layer disposed between the encapsulation layer and the color filter layer and including a light control pattern disposed on a light path of the organic light emitting layer; and a planarization layer disposed on the light control pattern and below the color filter layer, wherein an uppermost portion of the light control pattern is exposed through the planarization layer.

* * * * *